US010663286B2

(12) United States Patent
Chouaib et al.

(10) Patent No.: US 10,663,286 B2
(45) Date of Patent: May 26, 2020

(54) MEASURING THIN FILMS ON GRATING AND BANDGAP ON GRATING

(71) Applicant: KLA-Tencor Corporation, Milpitas, CA (US)

(72) Inventors: Houssam Chouaib, San Jose, CA (US); Zhengquan Tan, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 171 days.

(21) Appl. No.: 15/800,877

(22) Filed: Nov. 1, 2017

(65) Prior Publication Data
US 2019/0063900 A1 Feb. 28, 2019

Related U.S. Application Data

(60) Provisional application No. 62/548,579, filed on Aug. 22, 2017.

(51) Int. Cl.
G01B 11/06 (2006.01)
H01L 21/66 (2006.01)
(Continued)

(52) U.S. Cl.
CPC .......... G01B 11/06 (2013.01); G01B 11/0625 (2013.01); G01B 15/02 (2013.01);
(Continued)

(58) Field of Classification Search
CPC ............. G01B 11/06; G01N 2021/213; G01N 21/211; G01N 21/8422; H01L 22/12;
(Continued)

(56) References Cited

U.S. PATENT DOCUMENTS 7,465,590 B1    12/2008 Feng et al.
8,860,937 B1 *  10/2014 Dziura ................... G01N 21/47
                                          356/237.4
(Continued)

FOREIGN PATENT DOCUMENTS

KR    20040048405 A    6/2004

OTHER PUBLICATIONS

Chouaib & Zhao, Nanoscale optical critical dimension measurement of a contact hole using deep ultraviolet spectroscopic ellipsometry, J. Vac. Sci. Technol. B 31(1), Jan./Feb. 2013, 1-6.
(Continued)

Primary Examiner — Sunghee Y Gray
(74) Attorney, Agent, or Firm — Hodgson Russ LLP

(57) ABSTRACT

Methods and systems disclosed herein can measure thin film stacks, such as film on grating and bandgap on grating in semiconductors. For example, the thin film stack may be a 1D film stack, a 2D film on grating, or a 3D film on grating. One or more effective medium dispersion models are created for the film stack. Each effective medium dispersion model can substitute for one or more layers. A thickness of one or more layers can be determined using the effective medium dispersion based scatterometry model. In an instance, three effective medium dispersion based scatterometry models are developed and used to determine thickness of three layers in a film stack.

22 Claims, 18 Drawing Sheets

(51) Int. Cl.
*H01L 29/49* (2006.01)
*G01B 15/02* (2006.01)
*H01L 29/423* (2006.01)
*H01L 29/51* (2006.01)
*H01L 29/66* (2006.01)

(52) U.S. Cl.
CPC .......... *H01L 22/12* (2013.01); *H01L 29/4966* (2013.01); *H01L 22/20* (2013.01); *H01L 29/42364* (2013.01); *H01L 29/42376* (2013.01); *H01L 29/513* (2013.01); *H01L 29/517* (2013.01); *H01L 29/518* (2013.01); *H01L 29/66795* (2013.01)

(58) Field of Classification Search
CPC ......... H01L 29/42364; H01L 21/02288; H01L 21/28088; H01L 29/42376; H01L 29/4966; H01L 29/513; H01L 29/517; H01L 29/518; H01L 29/66795; B29C 2071/022; B29C 71/02; B32B 3/10; B32B 5/16; B32B 5/30; C09D 11/033; C09D 11/037; C09D 11/52; C23C 18/06; C23C 18/1254; C23C 18/1283; G03F 1/00; G03F 7/0002
USPC ............................................. 356/632; 702/28
See application file for complete search history.

(56) References Cited

U.S. PATENT DOCUMENTS

| | | | |
|---|---|---|---|
| 2004/0265477 A1* | 12/2004 | Nabatova-Gabain | G01B 11/0641 427/10 |
| 2005/0219529 A1* | 10/2005 | Nabatova-Gabain | G01N 21/211 356/369 |
| 2010/0036514 A1 | 2/2010 | Funk et al. | |
| 2010/0141274 A1 | 6/2010 | Keller et al. | |
| 2013/0006539 A1* | 1/2013 | Di | G01N 21/211 702/28 |
| 2013/0083320 A1 | 4/2013 | Gao et al. | |

OTHER PUBLICATIONS

Mihardja et al., Data feed-forward for improved optical CD and film metrology, Proc. of SPIE vol. 8324, 2012, 1-9.

Tzai et al., Apply multiple target for advanced gate ADI critical dimension measurement by scatterometry technology, Proc. of SPIE vol. 8324, 2012, 1-11.

ISA/KR, International Search Report for PCT/US2018/047363 dated Dec. 17, 2018.

* cited by examiner (a)

(b)

MEASURING THIN FILMS ON GRATING AND BANDGAP ON GRATING

CROSS-REFERENCE TO RELATED APPLICATIONS

This application claims priority to the provisional patent application filed Aug. 22, 2017 and assigned U.S. App. No. 62/548,579, the disclosure of which is hereby incorporated by reference.

FIELD OF THE DISCLOSURE

This disclosure relates to measuring thin films.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production and better device performance. Thus, minimizing the total time from detecting a yield problem to fixing it determines the return-on-investment for the semiconductor manufacturer.

To control device performance, in particular electrostatic characteristics, the critical dimensions (CD) of a device and thin film thicknesses are monitored. The gate dielectric, high-k, and work function materials and composition affect the device performance. This can impact, for example, the threshold voltage and the drive current. At the 10 nm node and below, some critical film thickness process windows can be below 0.3 A. Post-layer effect on pre-layer process is another issue that may need to be controlled. The metal gate deposition can alter the materials properties and their composition through annealing or diffusion in addition to potentially causing interfacial and crystalline defects. Therefore, it is becoming critical to measure every process step during formation of high-k metal gate stacks.

The high-k metal gate film formation process is complex. Typically, it can include six to nine film stacks depending on the technology node, application, and the device type (e.g., NMOS or PMOS).

In an example, after dummy-gate removal and oxide strip and clean, a series of ultra-thin materials are deposited on the gate prior to the deposition of the metal. Those materials are typically very thin and their optical dispersion properties are similar. In this example, the process starts with the deposition of an 8 A to 10 A $SiO_2$ interface layer (IL) on the gate (and fin). This can be followed by a 14 A hafnium-dioxide as high-k material. This is followed by 10 A TiN work function material, then a barrier metal TaN (5 A to 10 A), then another TiN layer, then a TiAlC layer, and then a 10 A TiN layer. The depositions can be formed through atomic layer deposition (ALD). PMOS and NMOS requires different high-k metal gate (HKMG) process flows, which can change the number of critical layers. The HKMG process is at the end of the front end of the line (FEOL) loop of the CMOS device.

Traditionally, these films were measured on a planar film stacks pad. X-ray metrology was used to measure the multi-layer stack on planar, but x-ray was insufficient because of the required precision 3 sigma (<0.04 A) and because of its insufficient sensitivity due to little scattering of the thin films.

For the optical metrology, the complex stacks induce highly correlated parameters. Fixing some thicknesses at a nominal value may be necessary to reduce the correlation. But this method is not a satisfactory solution for at least three reasons. First, the pre-layers process may not be stable enough to assign one fixed value for that parameter. Second, any process step can change the properties of the pre-layer. Third, throughput may be too slow for commercial manufacturing because multiple layers cannot be measured in one step.

Starting at the 10 nm technology node, semiconductor manufacturers have sought to measure some critical film thickness on grating (2D and 3D). The correlation of film thicknesses and/or properties measured on the 1D film pads to real device characteristics such as WAT (Wafer acceptance test like Vth) is degrading. Specifically, for some FinFET layers, 1D proxy film targets have limited correlation to real process variation on the real FinFET transistor. Due to the loading effect where the deposition and etch rates are topography dependent, the 1D film data will not be in perfect correlation with the 2D or 3D ones. Previous methods were used to perform these measurements, but both are either incapable of providing accurate measurements and/or too slow for commercial manufacturing. These previous methods are known as the "single angle of incidence (AOI) all floating" method and the "Data Feedforward" method.

The single AOI all floating method uses a single AOI spectroscopic ellipsometry spectrum or single AOI rotating polarizer rotating compensator (RPRC) spectrum and floats all critical parameters and degrees of freedom simultaneously. This method cannot solve most of the issues and the requirements described above. The all floating method also cannot deal with low contrast or thin materials. One reason is the similarity in the optical properties of $SiO_2$ and $HfO_2$ and of TiN and TaN. This leads to correlation between concurrent parameters and, therefore, inaccurate measured film on grating thicknesses. For example, see H. Chouaib and Q. Zhao, "Nanoscale optical critical dimension measurement of a contact hole using deep ultraviolet spectroscopic ellipsometry", J. Vac. Sci. Technol. B 31, 011803 (2013), which is incorporated by reference in its entirety. In an experiment, both simulation data and real experimental data obtained from the single AOI all floating method did not pass precision, accuracy, robustness, or wafer consistency tests. While the single AOI all floating method can potentially meet the throughput and cost of ownership (COO) requirements, it failed in most technical checks.

Below are examples of single AOI all floating method results. This example is a theoretical simulation of the expected parameters sensitivity, correlation, and precision. For this example, simulations are performed on fourteen HKMG layers. Only three layers are presented here. In the cap (TiN), the film stack is IL(SiO2)/High-k(HfO2)/TiN. In this structure, a total of eight geometrical parameters are floated simultaneously (FIG. 2).

The simulation shows that the expected precision 3 sigma of the three films IL, HK and Cap are 0.13 A, 0.13 A and 0.06 A, respectively. Semiconductor manufacturer specifications for precision may be as small as 0.03 A. This method fell short of the specifications in terms of precision. Also, parameters correlation indexes are 0.958, 0.958 and 0.846, respectively. For correlation, on the scale of zero to one when one represents a 100% parameter correlation, 0.958 and 0.846 correlations are considered high and represent a potential risk of the combined model and technique used. In addition to the simulation, the single AOI all floating method experimental data failed the robustness test and the precision test for this layer.

In the TaN layer, the film stack is IL(SiO2)/High-k (HfO2)/TiN/TaN. In this structure (FIG. 3), a total of nine parameters are floated simultaneously. The simulation showed poor precision results and high parameter correlation which do not meet the semiconductor manufacturer requirements for this layer. Experimental data also showed results that are out of specification.

In the N Metal Gate (NMG) deposition layer, the film stack complexity increases at the late stage of the HKMG process. The layer comprises several pre-layer stacks that affect the critical parameters measurement on grating. There are three critical parameters for this layer: the TaN (10 A), the TaL (40 A), and the TiN (8 A). These three layers must be measured simultaneously for two reasons. First, the TaN undergoes some treatment (recessed) and the wafer will go to TaL and TiN deposition within the same chamber. This prevents the wafer from going out of the chamber for a metrology step. The TaL and TiN are deposited in-situ. Hence the need for the tri-layer measurements using one recipe. The simulation data expects bad precision data and highly correlated parameters between all six film stacks. Thus, the single AOI all floating method cannot provide accurate measurements of this layer.

Data feedforward (DFF) refers to taking data sets on different pre-layers and passing common parameters forward to subsequent layers. For example, see Mihardja et al., Proc. SPIE 8324, Metrology, Inspection, and Process Control for Microlithography XXVI, 83241H (Mar. 29, 2012), which is incorporated by reference in its entirety. In other words, it refers to measuring each single step (pre-layer) and feedforwarding the data to the next step. This method is supposed to break the correlation between different film stacks. For instance, in previous steps it was possible to measure IL thickness and then feed forward the measurement results to the HK module when the HK film is to be measured. Similarly, it was possible to feedforward the HK value measured to the gate work function module. This method assumes that the pre-layers IL and HK are unchanged in terms of properties. However, this assumption is not valid for the current advanced technological nodes. DFF suffers from multiple drawbacks. First, the DFF throughput is too slow for semiconductor manufacturers. To use feedforward, every single step needs to be measured. The total number of film stacks to be measured may be, for example, fourteen. The predefined specification for throughput is to achieve robust measurements on all fourteen film stacks within only nine recipes or less. In other words, multiple layers need to be measured simultaneously, which is not possible with DFF.

Second, DFF cannot be used for the NMG (FIG. 4) layer and PMG layer. The TaL and TiN are deposited in-situ, such as using ALD. Moreover, the underlayer TaN undergoes some treatment within the same chamber as the following TaL+TiN deposition step. DFF cannot be used with this particular process flow.

Third, DFF assumes that the optical dispersion of the materials is unchanged before deposition and after deposition. This assumption may be incorrect. There are multiple phenomena that affect pre-layer properties after a new process such as annealing effect due to change in temperature during post-layer etch/dep, stress and strain variations due to post-layer deposition, or the surface and interface effects' impact on the optical properties of each layer at the angstrom scale.

Fourth, any inaccuracy or error in pre-layer model is carried out to all post layers.

Fifth, any Library Boundary Hit (LBH) in an early pre-layer stage will interrupt all measurements in post layers.

Neither DFF nor the single AOI all floating method can provide solutions to the film on grating market due to one or more of inaccurate data out of specifications linearity to a reference method, poor precision and stability and matching, highly correlated critical and floating parameters, slow measurement (i.e., low throughput), high COO, inability to handle in-situ ALD process, high risk for LBH, and robustness test failures.

Therefore, an improved method and system for measuring thin films is needed.

BRIEF SUMMARY OF THE DISCLOSURE

In a first embodiment, a method is provided. A first effective medium dispersion model for a film stack on a wafer is developed using a controller. The film stack includes at least four layers. The first effective medium dispersion model substitutes for all but a first layer of the layers. The first layer is a top layer of the film stack opposite the wafer. A thickness of the first layer is determined using the controller and the first effective medium dispersion model. A second effective medium dispersion model for the film stack based on the thickness of the first layer is developed using the controller. The second effective medium dispersion model substitutes for all but the first layer and a second layer of the layers. The second layer is adjacent the first layer. A thickness of the second layer is determined using the controller and the second effective medium dispersion model. A third effective medium dispersion model for the film stack based on the thickness of the first layer and the thickness of the second layer is developed using the controller. The third effective medium dispersion model substitutes for all but the first layer, the second layer, and a third layer of the layers. The third layer is adjacent the second layer. A thickness of the third layer is determined using the controller and the third effective medium dispersion model.

The layers can include an oxide layer, a high k layer, a TiN layer, a TaN layer, a TaL layer, and a second TiN layer, though other materials or combinations of materials are possible. In an instance, the first layer is the second TiN layer, the second layer is the TaL layer, and the third layer is the TaN layer. In another instance, a combined thickness of the oxide layer, the high k layer, the TiN layer, the TaN layer, and the TaL layer is 8 nm or less.

The first effective medium dispersion model can substitute for an oxide layer, a high k layer, a TiN layer, a TaN layer, a TaL layer. The second effective medium dispersion model can substitute for an oxide layer, a high k layer, a TiN layer, and a TaN layer. The third effective medium dispersion model can substitute for an oxide layer, a high k layer, and a TiN layer.

The first effective medium dispersion model, the second effective medium dispersion model, and the third effective medium dispersion model can each have different optical properties.

The method can further include measuring the film stack by one or more of generating rotating polarizer rotating compensator spectroscopic ellipsometry data, full Muller matrix components data, rotating polarizer spectroscopic ellipsometry data, reflectometry data, laser driven spectroscopic reflectometry data, or x-ray data.

Developing the first effective medium dispersion model can include collecting optical responses of the film stack; building a first scatterometry model, using a model building module, by combining all but the first layer of the layers in a first effective medium; creating a dispersion model for the first effective medium that includes a dispersion formula; receiving the optical responses at multiple angles of incidence at a fitting analysis module; performing, using the fitting analysis module, parallel fitting on the optical responses while floating the dispersion model in each spectrum regression; evaluating one or more outcomes of the dispersion model at the angles of incidence to determine similarity; transforming the dispersion model into a table; performing a fitting analysis using the first scatterometry model where the dispersion model is fixed as the table and the thickness of the first layer is floating; measuring the thickness of the first layer; and comparing the thickness of the first layer to a reference. A feedback loop configured to optimize the dispersion model can be applied after the evaluating. The feedback loop may be configured to fix or float parameters of the dispersion model. At least one parameter of the dispersion model may be treated as common during the parallel fitting.

Developing the second effective medium dispersion model can include building a second scatterometry model, using a model building module, by combining all but the first layer and the second layer of the layers in a second effective medium; forwarding the thickness of the first layer into the second scatterometry model; creating a dispersion model for the second effective medium that includes a dispersion formula; receiving the optical responses at multiple angles of incidence at a fitting analysis module; performing, using the fitting analysis module, parallel fitting on the optical responses while floating the dispersion model in each spectrum regression; evaluating one or more outcomes of the dispersion model at the angles of incidence to determine similarity; transforming the dispersion model into a table; and performing a fitting analysis using the second scatterometry model where the dispersion model is fixed. A feedback loop configured to optimize the dispersion model can be applied after the evaluating. The feedback loop may be configured to fix or float parameters of the dispersion model. At least one parameter of the dispersion model may be treated as common during the parallel fitting or the thickness of the first layer is treated as common during the parallel fitting.

Developing the third effective medium dispersion model can include building a third scatterometry model, using a model building module, by combining all but the first layer, the second layer, and the third layer of the layers in a third effective medium; forwarding the thickness of the first layer and the thickness of the second layer into the third scatterometry model; creating a dispersion model for the third effective medium that includes a dispersion formula; receiving the optical responses at multiple angles of incidence at a fitting analysis module; performing, using the fitting analysis module, parallel fitting on the optical responses while floating the dispersion model in each spectrum regression; evaluating one or more outcomes of the dispersion model at the angles of incidence to determine similarity; transforming the dispersion model into a table; and performing a fitting analysis using the third scatterometry model where the dispersion model is fixed. A feedback loop configured to optimize the dispersion model can be applied after the evaluating. The feedback loop may be configured to fix or float parameters of the dispersion model. The thickness of the first layer, the thickness of the second layer, and the thickness of the third layer can be reported. At least one parameter of the dispersion model may be treated as common during the parallel fitting or the thickness of the first layer is treated as common during the parallel fitting.

The film stack may be a 1D film stack, a 2D film on grating, or a 3D film on grating.

A first effective medium based scatterometry model, a second effective medium based scatterometry model, and a third effective medium based scatterometry model can be considered virtual targets. A fitting analysis can be run in parallel.

The at least four layers may each be one of $SiO_2$, $HfO_2$, HfSiON, HfON with a nitrogen concentration, TiN, TaN, TaAlC, TiAlC, W, Co, WC, or TaO. In an instance, at least one of the four layers is one of HfON, TiN, or TaN, and the method further determines a nitrogen concentration.

One of the first effective medium dispersion model, the second effective medium dispersion model, or the third effective medium dispersion model may be a dispersion formula that models the optical properties of a material as a function of photon energy or wavelength.

A computer program product comprising a non-transitory computer readable storage medium having computer readable program embodied therewith can be used. The computer readable program can be configured to carry out the method of any of the different variations or examples of the first embodiment.

In a second embodiment, a system is provided. The system includes a measurement system configured to measure a wafer and a controller. The controller includes a processor and an electronic data storage unit in electronic communication with the processor. The controller is in electronic communication with the measurement device. The processor is configured to execute one or more software modules. The one or more software modules are configured to develop a first effective medium dispersion model for a film stack on a wafer and determine a thickness of the first layer using the first effective medium dispersion model. The film stack includes at least four layers. The first effective medium dispersion model substitutes for all but a first layer of the layers. The first layer is a top layer of the film stack opposite the wafer.

The software modules can be further configured to develop a second effective medium dispersion model for the film stack based on the thickness of the first layer and determine a thickness of the second layer using the second effective medium dispersion model. The second effective medium dispersion model substitutes for all but the first layer and a second layer of the layers. The second layer is adjacent the first layer.

The software modules can be further configured to develop a third effective medium dispersion model for the film stack based on the thickness of the first layer and the thickness of the second layer and determine a thickness of the third layer using the third effective medium dispersion model. The third effective medium dispersion model substitutes for all but the first layer, the second layer, and a third layer of the layers. The third layer is adjacent the second layer.

The measurement system can provide one of rotating polarizer rotating compensator spectroscopic ellipsometry data, full Muller matrix components data, rotating polarizer spectroscopic ellipsometry data, reflectometry data, laser driven spectroscopic reflectometry data, or x-ray data.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein overcome a number of drawbacks related to measuring thin film stacks, such as film on grating and bandgap on grating in semiconductors. Embodiments of the method can solve a wide range of issues in optical critical dimensions and films. Thin film measurement of high k metal gate on grating and other materials in which the floated parameters correlation can be reduced are disclosed. The parameters sensitivities can be enhanced by accurately measuring optical properties of multiple effective medium, by using multiple scatterometry models within the same layer, by feedforwarding data between the multiple models, or by an apparatus that scans the angle of incidence while collecting an optical signal prior to the modeling.

In particular, the techniques disclosed herein can measure the high-k metal gate (HKMG) thin films on grating and the bandgap on grating. The film on grating market is growing as the dimensions are shrinking. The 2D and 3D structures are more complex than a one dimensional film stack. The film on grating adds more degree of freedom to the model and therefore potential instability, correlation, and parameters interaction. There is value in measuring these thin, highly correlated materials on 3D proxy structures that resemble the geometry of the real device. The techniques disclosed herein can provide measurements rapidly, accurately, and precisely, which is attractive to semiconductor manufacturers.

Embodiments of the disclosed techniques, systems, and algorithms overcome multiple technical challenges. First, all the materials to be measured ($SiO_2$, $HfO_2$, TiN, TaN, TiAlN, TiAlC, etc.) are typically low contrast materials and exhibit similar optical response. $SiO_2$/$HfO_2$ and TiN/TaN/TiAl especially tend to exhibit similar optical response. This can make the film thicknesses highly correlated.

Figure 1:
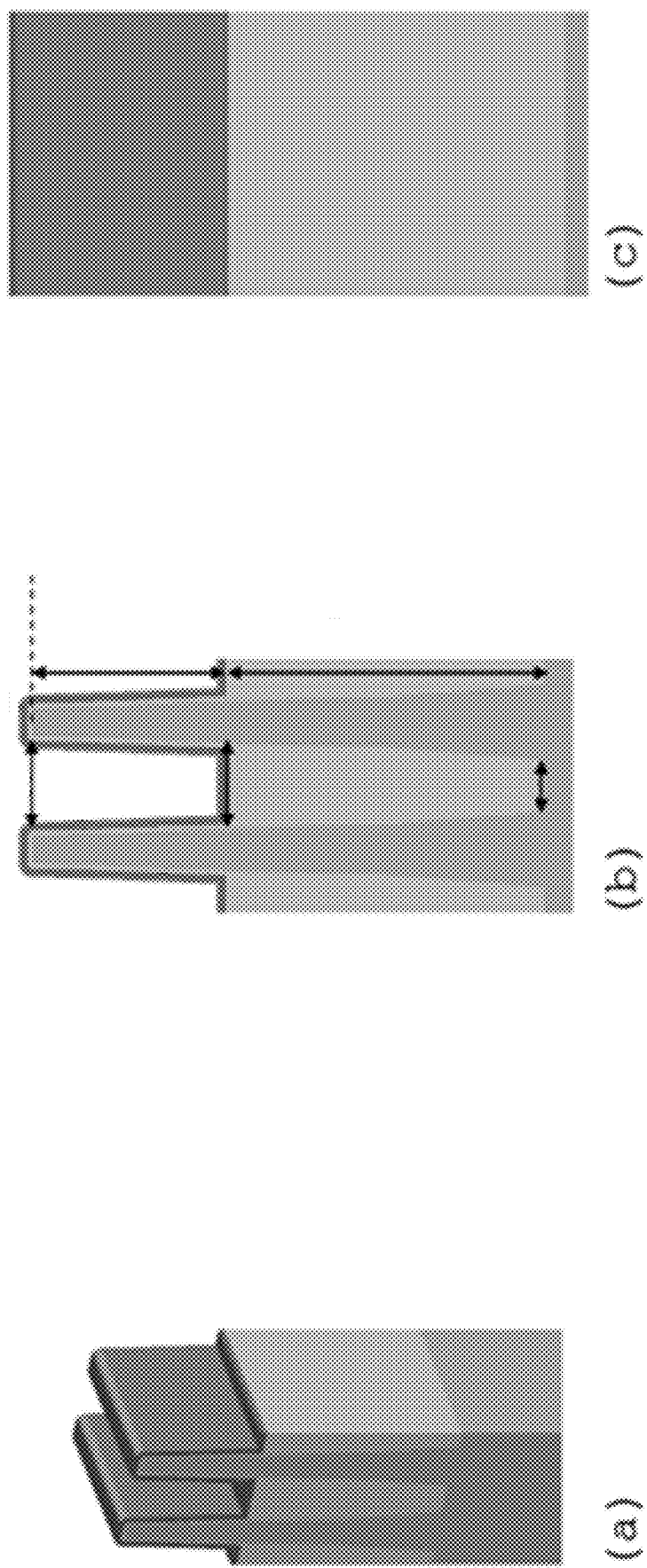
FIG. 1 is a film on 2D grating structure with nine degree of freedom including material dispersions in (a) an isometric view, (b) a front view, and (c) a side view.

Second, all films are measured on grating, which means that at least five additional degree of freedom need to be added to the model (see FIG. 1).

Third, the films are thin and the semiconductor manufacturer specifications can be narrow. A typical requirement for precision 3 sigma is 0.03 A. Some minor parameters correlation can affect the precision. FOG precision specifications may be very small compared to OCD precision. Therefore, FOG precision is very challenging.

Fourth, while typical OCD accuracy requirement is sub nanometer level, the film on grating accuracy level is sub Angstrom. FOG accuracy specifications tend to be tight. A design of experiments (DOE) range may be of few angstroms. The data may need to track the DOE well with excellent linearity.

Fifth, the metrology results may need a particular robustness, such as pre-layer DOE.

Sixth, the metrology results may need to also meet a particular throughput requirement for semiconductor manufacturers. Multi films may be measured per layer.

Seventh, the wafer range may need to be reasonable and as expected. The interface layer (IL) within wafer variation can be smaller than 0.7 A. Typical HfO$_2$ wafer range is below 1.2 A. A metrology solution with a wafer range that exceeds 1.2 A for HfO$_2$ is questionable and could be rejected for lack of accuracy or parameters correlation.

Eighth, all data may need to be consistent within wafer and wafer-to-wafer expectations Ninth, pre-layer data feedforward is not used for reasons previously discussed.

Techniques disclosed herein can make the precision of the FOG critical parameters ten times better than previous techniques. Correlation between all critical and floating parameters can be broken, which will lead to improved robustness. Measurement speed (number of wafer per hour) is improved. Multiple sequential films can be measured using a single measurement. These techniques can handle in-situ ALD processes. Contrast is improved between different film stacks. Library boundary hit (LBH) risk can be reduced by building robust models.

To address the technical challenges above, there are multiple models within one layer. Each model uses the effective medium approach to combine two or more film stacks in one. Data can be feedforwarded from one model to another model to measure more film stacks. The feedforward is performed within the same layer. Such within layer data feedforward can be referred to as same structure data feedforward (SSDF).

Figure 4:
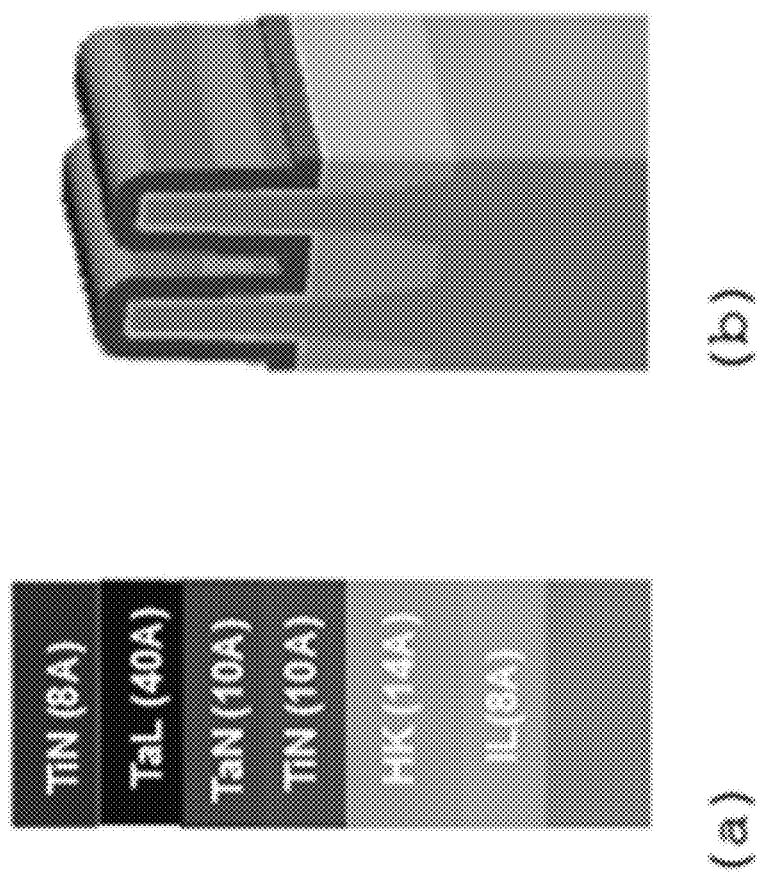
FIG. 4 illustrates (a) the NMG dep film stack and (b) the FOG NMG model, which were subject to the single AOI all floating method simulation.
Figure 6:
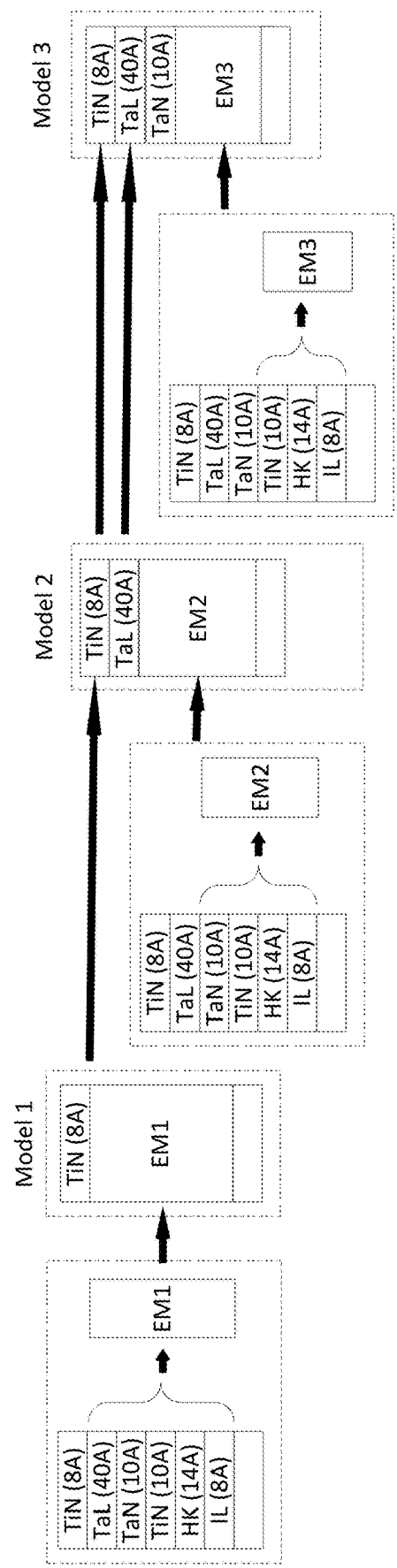
FIG. 6 is a description of the modeling method referred to as the "Same Structure Data Feedforward" (SSDF) concept used to break the correlation, improve the data accuracy and the recipe robustness, and that was used successfully in nine different layers.

The disclosed technique was successfully applied on several FOG layers. To clarify the concept, the NMG Deposition layer of FIG. 4 is taken as an example of a successful use case. The diagram of FIG. 6 depicts the concept of the SSDF. For the NMG layer, three critical parameters should be measured accurately within one layer without the use of any pre-layer feedforward strategy. To deliver three critical parameters, three models using three different effective medium dispersions can be developed.

Figure 17:
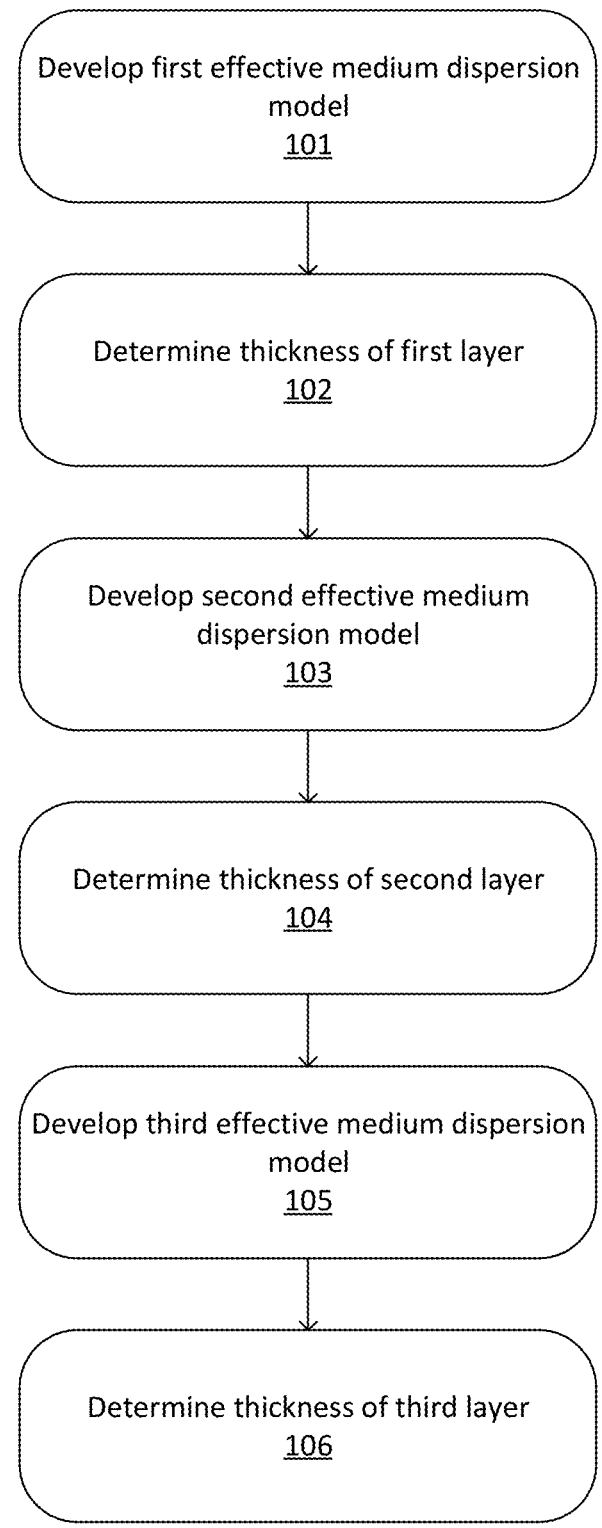
FIG. 17 is a flowchart illustrating an embodiment of method in accordance with the present disclosure.

A method 100 of an embodiment is illustrated in FIG. 17. Some or all of the steps of the method 100 can be performed on the controller. The method 100 can be used with a film stack on a wafer. The film stack, which may be a 1D or 2D film stack or a 2D or 3D film on grating, can include at least four layers. The film on grating can be any material or an alloy or composite of the material. For example, the layers can include an oxide layer, a high k layer, a TiN layer, a TaN layer, a TaL layer, and a second TiN layer. A combined thickness of the oxide layer, the high k layer, the TiN layer, the TaN layer, and the TaL layer may be 8 nm or less, though the technique can be used with larger thicknesses. In an example, the first layer is the second TiN layer, the second layer is the TaL layer, and the third layer is the TaN layer. In another example, the at least four layers are each one of SiO$_2$, HfO$_2$, HfSiON, HfON with a nitrogen concentration, TiN, TaN, TaAlC, TiAlC, W, Co, WC, or TaO.

At 101, a first effective medium dispersion model is developed for the film stack. The first effective medium dispersion model can substitute for all but a first layer of the layers. The first layer is a top layer of the film stack opposite the wafer.

At 102, a thickness of the first layer is determined using the first effective medium dispersion model.

At 103, a second effective medium dispersion model is developed for the film stack based on the thickness of the first layer. The second effective medium dispersion model substitutes for all but the first layer and a second layer of the layers. The second layer is adjacent the first layer.

At 104, a thickness of the second layer is determined using the second effective medium dispersion model.

At 105, a third effective medium dispersion model is developed for the film stack based on the thickness of the first layer and the thickness of the second layer. The third effective medium dispersion model substitutes for all but the first layer, second layer, and third layer of the layers. The third layer is adjacent the second layer.

At 106, a thickness of the third layer is determined using the third effective medium dispersion model.

In method 100, the first effective medium dispersion model can substitute for an oxide layer, a high k layer, a TiN layer, a TaN layer, a TaL layer. The second effective medium dispersion model can substitute for an oxide layer, a high k layer, a TiN layer, and a TaN layer. The third effective medium dispersion model can substitute for an oxide layer, a high k layer, and a TiN layer.

The first effective medium dispersion model, the second effective medium dispersion model, and the third effective medium dispersion model can each have different optical properties.

The method 100 can further include measuring the film stack by or more of generating rotating polarizer rotating compensator spectroscopic ellipsometry data, full Muller matrix components data, rotating polarizer spectroscopic ellipsometry data, reflectometry data, laser driven spectroscopic reflectometry data, and/or x-ray data.

The first effective medium dispersion model, the second effective medium dispersion model, and the third effective medium dispersion model can be considered virtual targets. A fitting analysis can be run in parallel in a tri-target measurement mode using the three effective medium models. This particular technique is referred to as the multi-target measurement (MTM). For example, see Tzai et al., Proc. SPIE 8324, Metrology, Inspection, and Process Control for Microlithography XXVI, 832420 (Mar. 29, 2012), which is incorporated by reference in its entirety. This technique can include generating rotating polarizer rotating compensator spectroscopic ellipsometry data, full Muller matrix components data, rotating polarizer spectroscopic ellipsometry data, reflectometries data, laser driven spectroscopic reflectometry data and/or x-ray data by measuring the specimen. A model building and analysis engine, which includes a geometric model building module with predefined building blocks, can generate models of the structure of the specimen. A fitting analysis module may be configured to receive the optical responses. During operation, the thickness of the first layer or any other parameter can be treated as common and a fitting analysis using the multi target module can be performed to optimize the first effective medium and/or second effective medium and/or third effective medium.

One of the first effective medium dispersion model, the second effective medium dispersion model, or the third effective medium dispersion model is a dispersion formula that models the optical properties of a material as a function of photon energy or wavelength. For example, one of the first effective medium dispersion model, the second effective medium dispersion model, or the third effective medium dispersion model can be a Tauc-Lorentz model, a Cauchy model, a BEMA model, a Cody-Lorentz model, a Cody-Lorentz Continuous model, or an NKOffset model. This may be in addition to or instead of a harmonic oscillator, which also can be referred to as the Lorentz model.

At least one of the four layers can be one of HfON, TiN, or TaN. The method 100 can further include determining a nitrogen concentration, such as from the effective medium dispersion.

While three effective medium dispersion models are disclosed in method 100, in an instance only the first effective medium dispersion model is developed. This can be used to determine the thickness of the first layer. In another instance only the first effective medium dispersion model and second effective medium dispersion model are developed. These can be used to determine the thickness of the first layer and the second layer. Furthermore, more than three effective medium dispersion models can be created. In an instance, an effective medium dispersion model may be developed for nearly all the layers. This may be four, five, or even ten different effective medium dispersion models depending on the device design.

In an instance, developing the first effective medium dispersion model can include collecting optical responses of the film stack. The optical spot is halted while scanning the angle of incidence (AOI) to collect a series of optical responses on 2D or 3D film on grating structure.

A first scatterometry model ("model1") is built, using a model building module, by combining all but the first layer of the layers in a first effective medium ("EM1"). The first scatterometry model can include two mediums: the first effective medium and the last film on grating ("Film1"). A scatterometry model, such as that seen in FIG. 2(b) and FIG. 3(b), can include at least one effective medium dispersion model or table.

A dispersion model is created for the first effective medium that includes a dispersion formula. The dispersion formula can be in the first scatterometry model. A dispersion formula can be, but is not limited to, any of the dispersion models disclosed herein. The dispersion formula can mix two or more materials together and can vary in a fitting analysis module.

The optical responses are received at multiple angles of incidence at a fitting analysis module. Using the fitting analysis module, parallel fitting is performed on the optical responses while floating the dispersion model in each spectrum regression. One or more outcomes of the dispersion model are evaluated at the angles of incidence to determine similarity. This can be performed manually, by the fitting analysis module, or using other techniques. For example, consistency of the outcomes of the multiple parallel fitting is determined. If the first effective medium dispersions are not similar, then a feedback loop configured to optimize the dispersion model after the evaluating can be applied. The feedback loop can be configured to fix or float parameters of the dispersion model. After the first effective medium model is optimized, then the parallel fitting can be performed again and the consistency of the outcome fitting can be determined. The feedback loop can be run again if the first effective medium dispersions are still not consistent.

The floated dispersion parameters from the different AOI measurements may need to match. This can indicate that no further feedback loop is needed. The dispersion parameters may not be identical, but the resulting dispersions may be within the accuracy specifications, within the noise level of a system, or within the system to system matching specifications. If embodiments of the disclosed method are automated, then a user can input and/or define specifications or when to terminate the feedback loop.

The dispersion model can be transformed into a table. This transformation may be performed after the first effective medium dispersion are similar. The first effective medium dispersion of the combined films (not including the first layer) may then be considered accurate.

A fitting analysis can be performed using the first scatterometry model where the dispersion model is fixed as the table and the thickness of the first layer is floating. The thickness of the first layer is measured. The thickness of the first layer can be compared to a reference to validate the first scatterometry model.

At least one parameter of the dispersion model can be treated as common during the parallel fitting.

Developing the second effective medium dispersion model can include building a second scatterometry model ("model2"), using a model building module, by combining all but the first layer and the second layer of the layers in a second effective medium ("EM2"). The second scatterometry model can include three mediums: the second effective medium and the last two films on grating (Film1 and "Film2").

The thickness of the first layer can be forwarded into the second scatterometry model. Since both models are different representations of the same structure, this can be referred to as SSDF.

A dispersion model is created for the second effective medium that includes a dispersion formula. The dispersion formula can be in the second scatterometry model.

The optical responses are received at multiple angles of incidence at a fitting analysis module. Using the fitting analysis module, parallel fitting is performed on the optical responses while floating the dispersion model in each spectrum regression. One or more outcomes of the dispersion model are evaluated at the angles of incidence to determine similarity. This can be performed manually, by the fitting analysis module, or using other techniques. For example, consistency of the outcomes of the multiple parallel fitting is determined. If the second effective medium dispersions are not similar, then a feedback loop configured to optimize the dispersion model after the evaluating can be applied. The feedback loop can be configured to fix or float parameters of the dispersion model. After the second effective medium model is optimized, then the parallel fitting can be performed again and the consistency of the outcome fitting can be determined. The feedback loop can be run again if the second effective medium dispersions are still not consistent.

The dispersion model can be transformed into a table. This transformation may be performed after the second effective medium dispersion are similar. The second effective medium dispersion of the combined films (not including the first or second layers) may then be considered accurate.

A fitting analysis can be performed using the second scatterometry model where the dispersion model is fixed as the table. The thickness of the second layer is measured.

At least one parameter of the dispersion model or the thickness of the first layer can be treated as common during the parallel fitting.

Developing the third effective medium dispersion model can include building a third scatterometry model ("model3"), using a model building module, by combining all but all but the first layer, the second layer, and the third layer of the layers in a third effective medium ("EM3"). The third scatterometry model can include four mediums: the third effective medium and the last three films on grating (Film1, Film2, and "Film3").

The thicknesses of the first layer and the second layer can be forwarded into the third scatterometry model. For example, the thickness of the first layer can be forwarded from the first scatterometry model to the second scatterometry model and the thickness of the second layer can be forwarded to the third scatterometry model. Since the three models are different representations of the same structure, this can be referred to as SSDF.

A dispersion model is created for the third effective medium that includes a dispersion formula. The dispersion formula can be in the third scatterometry model.

The optical responses are received at multiple angles of incidence at a fitting analysis module. Using the fitting analysis module, parallel fitting is performed on the optical responses while floating the dispersion model in each spectrum regression. One or more outcomes of the dispersion model are evaluated at the angles of incidence to determine similarity. This can be performed manually, by the fitting analysis module, or using other techniques. For example, consistency of the outcomes of the multiple parallel fitting is determined. If the third effective medium dispersions are not similar, then a feedback loop configured to optimize the dispersion model after the evaluating can be applied. The feedback loop can be configured to fix or float parameters of the dispersion model. After the third effective medium model is optimized, then the parallel fitting can be performed again and the consistency of the outcome fitting can be determined. The feedback loop can be run again if the third effective medium dispersions are still not consistent.

The dispersion model can be transformed into a table. This transformation may be performed after the third effective medium dispersion are similar. The third effective medium dispersion of the combined films (not including the first, second, or third layers) may then be considered accurate.

A fitting analysis can be performed using the second scatterometry model where the dispersion model is fixed as the table. The thickness of the third layer is measured. The thicknesses of the first layer, second layer, and third layer can be reported.

At least one parameter of the dispersion model or the thickness of the first layer can be treated as common during the parallel fitting.

The fitting analysis (e.g., the inverse problem regression) disclosed herein as part of the fitting analysis module can be performed using a neural network based library or using other techniques.

Any of the effective medium dispersions can be used to measure a bandgap on grating of the film on grating.

Effective medium theory can be used for any light/matter interaction in the subwavelength regime. Since the total thickness of IL, HK, TiN, TaN, and TaL may be of about 8 nm and the typical scatterometry spectra wavelengths range may be from 150 nm to 2000 nm, the deep subwavelength regime approximation may be valid. Maxwell equations can then be solved in the small-depth limit. The effective properties of the first effective medium (and the second and third effective mediums) depend on the optical properties [n,k] as well as the thicknesses of all materials forming the effective medium: IL, HK, TiN, TaN, TaL, etc. Data generated by the models of FIG. 6 may depend upon the accuracy of the effective medium optical indices. In addition to the innovative method described in FIG. 6, part of the method used to determine the effective medium optical indices which are described below and can depend on the apparatus.

Figure 7:
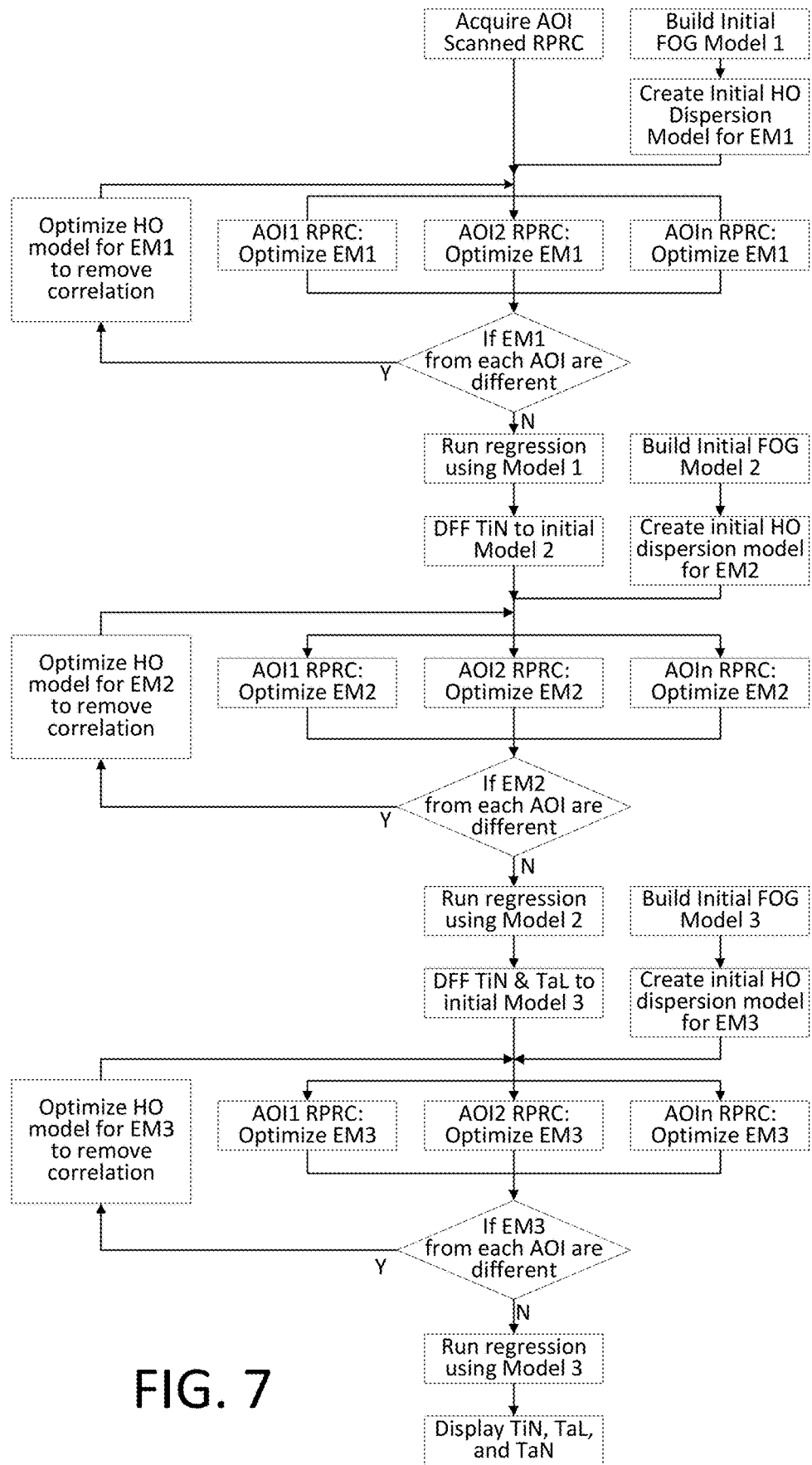
FIG. 7 is a flowchart of a method in accordance with the present disclosure.

The flow chart of FIG. 7 summarizes another embodiment of the present disclosure. The first step is to acquire a series of RPRC spectra by scanning the angles of incidence (AOI) (1). The AOI is the direction of a beam of light relative to the z-axis that is perpendicular to a wafer planar surface. Then, the initial first effective medium dispersion model depicted in FIG. 6 can be built (2). An initial model refers to a model that is not optimized yet. In this case, the initial first effective medium dispersion model includes a first effective medium dispersion that is considered inaccurate and not optimized yet. To optimize the first effective medium dispersion, a dispersion model is created and its parameters are varied (3). Here, the dispersion model used to develop the effective medium dispersion may be the Lorentz model or also called the harmonic oscillator (HO) model. The model considers the oscillations of electrons bound to atoms in a material under an incident light (e.g., electromagnetic wave) as an ensemble of harmonic oscillators. The representation of the material the dielectric constant can be as follows.

$$\varepsilon(E) = n_b + \frac{\sum_{s=1}^{m} H_s(E)}{1 - \sum_{s=1}^{m} v_s H_s(E)}$$

In the equation above, $n_b$ is the uniform background index (default value=1), E is the electric field energy (in eV) expressed as a function of the wavelength $\lambda$ (in nm) by $E=1,240/\lambda$, $H_s$ is the contribution of the $s^{th}$ oscillator (as described below), and $v_s$ is the local field correction factor for the $s^{th}$ oscillator.

$v_s$ is equal to zero for metals, close to zero for most semiconductors, and equal to 0.333 for ideal dielectrics.

$H_s$ is given by the following equation.

$$H_s = \frac{16\pi N_s R_y^2 r_0^3}{(E_{ns}^2 - E^2 + iE_{gs}E)} e^{-i\Phi_s}$$

In the equation above, Ry is the Rydberg constant (Ry=13.6058 eV), $r_0$ is the Bohr radius ($r_0$=0.0529177 nm), $N_s$ (or Nosc) is the number density of the $s^{th}$ oscillator, in $nm^{-3}$, which represents the relative importance of this oscillator, $E_{ns}$ (or $E_n$) is its resonance energy or the critical point, in eV (the lowest $E_n$ is often called the bandgap energy), $E_{gs}$ (or Eg) is its damping constant energy in eV, and $\Phi_s$ (or Phi) is its (relative) phase (in radians).

The Lorentz HO model is used to describe material optical properties, including those with several peaks. These materials can include semiconductors materials such as Si, Ge, SiGe, or even metals such as W, Cu, Co, Ti, TiN, TaN, etc. As it can be seen, each oscillator in the Lorentz model contains five unknown parameters: Nosc, En, Eg, $\Phi_s$ and $v_s$. A typical dispersion model for semiconductors materials and metals needs between four to eight oscillators in the wavelength range of 190 nm to 850 nm. The number of possible variables in such an HO based dispersion model is, therefore, between 20 (5×4) to 40 (5×8). The high number of degree of freedom (e.g., 20 to 40) and the lack of reference may be the most challenging part in the measurement of the effective medium. It results in material parameter correlation and can lead to multiple solutions. Some low sensitive parameters may be fixed to reduce the correlation and improve the effective medium dispersion accuracy. This method of float or fix may be referred to as the HO model optimization. If not performed well, the wrong effective medium dispersion could be extracted. The measurement of a correct effective medium dispersion can be more complex than the measurement of a single material dispersion. The effective medium dispersion may depend on the dispersion of two or more materials and their thicknesses, so care may be taken when effective medium dispersion properties are extracted from an optical response. Scanning the AOI helps in developing accurate effective medium dispersions. One aspect that can help provide accurate and reliable effective medium dispersion is to be AOI independent. Scanning the AOI can assure isotropic effective medium. An isotropic effective medium dispersion can be beneficial. Using this condition, the effective medium can be checked for accuracy by comparing each measured effective medium dispersion from each AOI spectrum. Regression is run on the AOI1 (4), and AOI2 (5) . . . and AOIn (5). n effective medium dispersions can emerge from the N regressions. The n effective medium dispersions are then compared (6). If the effective medium dispersions are inconsistent (7), then it means the HO model is not optimized enough and may need further optimization to reduce the parameters correlation (8). A feedback loop can be created. Multiple iterations can be performed. Once the first effective medium dispersions are consistent from the different AOI, the first effective medium dispersion is then considered accurate. Then first effective medium dispersion model may then be ready and the top film (TiN in this particular example) thickness can be measured (9).

The initial second effective medium dispersion model is built (10). To optimize the second effective medium dispersion, a dispersion model is created and its parameters are varied (11). TiN thickness from the first effective medium dispersion model is then feedforwarded to the second effective medium dispersion model (12). Using the TiN thickness from the first effective medium dispersion model can help reduce the correlation in the second effective medium dispersion model to optimize the second effective medium and assure consistency with the first effective medium dispersion model. The procedure used to extract a first effective medium is repeated for the second effective medium. A regression is run on the AOI1 (13), and AOI2 (14) . . . and AOIn (15). n second effective medium dispersions emerge from the N regressions. The n second effective medium dispersions are then compared (16). If the second effective medium dispersions are inconsistent (17), then the HO model is not optimized enough and may need further optimization to reduce the parameters correlation (18). A feedback loop can be created. Multiple iterations can be performed. Once the second effective medium dispersions are consistent from the different AOI, the second effective medium dispersion is then considered accurate. Then second effective medium dispersion model is ready and the second film (TaL in this particular example) thickness is measured through regression.

The initial third effective medium dispersion model is built (19). To optimize the third effective medium dispersion, a dispersion model is created and its parameters are varied (20). TiN thickness from the first effective medium dispersion model and TaL from second effective medium dispersion model are then feedforwarded to the third effective medium dispersion model (21). Using the TiN and TaL thickness from the first and second effective medium dispersion models can help reduce the correlation in the third effective medium dispersion model to optimize the third effective medium and assure consistency with the first and second effective medium dispersion models. The same procedure used to extract the first effective medium and second effective medium is repeated for the third effective medium. Regression is run on the AOI1 (22), and AOI2 (23) . . . and AOIn (24). N third effective medium dispersions emerge from the N regressions. The N third effective medium dispersions are then compared (25). If the third effective medium dispersions are inconsistent (17), then the HO model is not optimized enough and may need to be further optimized to reduce the parameters correlation (18). A feedback loop can be created. Multiple iterations can be performed. Once the third effective medium dispersions are consistent from the different AOI, the third effective medium dispersion is then considered accurate. Then the third effective medium dispersion model is ready and the top TaN thickness is measured through regression.

While three models are disclosed, it is possible to only determine a first effective medium dispersion model. In another instance, only a first effective medium dispersion model and a third effective medium dispersion model are determined. Thus, the step of determining one or more of the effective medium dispersion models can be skipped. Furthermore, more than two or three effective medium dispersion models can be used. Furthermore, while particular materials are disclosed for the various layers, the technique can be applied to other materials.

Figure 5:
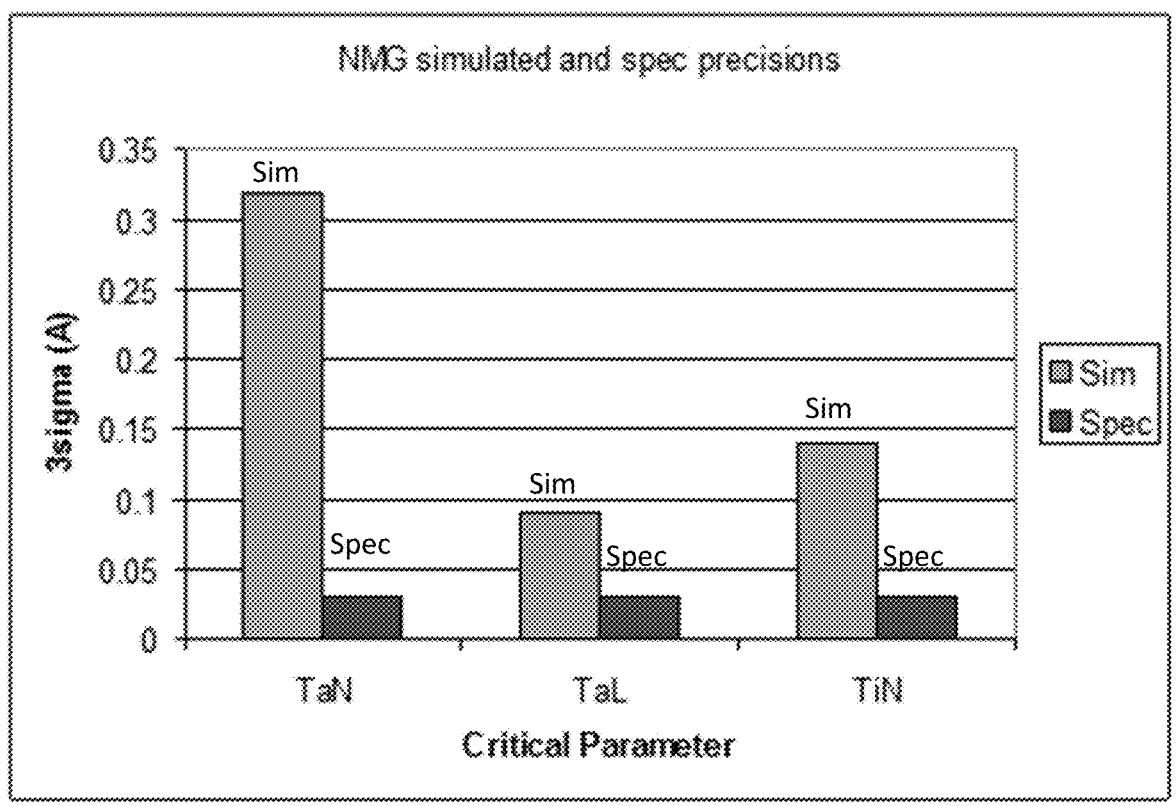
FIG. 5 is a comparison of simulated precision using an old method and the semiconductor manufacturer specification.

FIG. 5 is a block diagram of an embodiment of a system 300. The system 300 includes a chuck 306 configured to hold a wafer 307 or other workpiece. The chuck 306 may be configured to move or rotate in one, two, or three axes. The chuck 306 also may be configured to spin, such as around the Z-axis.

The system 300 also includes a measurement system 301 configured to measure part of a surface, a device, a feature, or a layer on the wafer 307. The measurement system 301 may produce a beam of light, a beam of electrons, broad band plasma, or may use other techniques to measure a surface of the wafer 307. In one example, the measurement system 301 includes a laser. In another example, the system 300 is a broad-band plasma inspection tool. The measurement system 301 can provide images of dies on the wafer 307 or can provide information used to form images of dies on the wafer 307.

In particular, the system 300 or measurement system 301 can be configured to provide one or more of rotating polarizer rotating compensator spectroscopic ellipsometry data, full Muller matrix components data, rotating polarizer spectroscopic ellipsometry data, reflectometry data, laser driven spectroscopic reflectometry data, or x-ray data.

The system 300 communicates with a controller 302. For example, the controller 302 can communicate with the measurement system 301 or other components of the system 300. The controller 302 can include a processor 303, an electronic data storage unit 304 in electronic communication with the processor 303, and a communication port 305 in electronic communication with the processor 303. It is to be appreciated that the controller 302 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 302 to implement various methods and functions may be stored in controller readable storage media, such as a memory in the electronic data storage unit 304, within the controller 302, external to the controller 302, or combinations thereof.

The controller 302 can include one or more processors 303 and one or more electronic data storage units 304. Each processor 303 may be in electronic communication with one or more of the electronic data storage units 304. In an embodiment, the one or more processors 303 are communicatively coupled. In this regard, the one or more processors 303 may receive readings received at the measurement system 301 and store the reading in the electronic data storage unit 304 of the controller 302. The controller 302 may be part of the system itself or may be separate from the system (e.g., a standalone control unit or in a centralized quality control unit).

The controller 302 may be coupled to the components of the system 300 in any suitable manner (e.g., via one or more transmission media, which may include wired and/or wireless transmission media) such that the controller 302 can receive the output generated by the system 300, such as output from the measurement system 301. The controller 302 may be configured to perform a number of functions using the output. For instance, the controller 302 may be configured to measure layers on the wafer 307. In another example, the controller 302 may be configured to send the output to an electronic data storage unit 304 or another storage medium without reviewing the output. The controller 302 may be further configured as described herein.

The controller 302, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The system 300 may be part of a defect review system, an inspection system, a metrology system, or some other type of system. Thus, the embodiments disclosed herein describe some configurations that can be tailored in a number of manners for systems having different capabilities that are more or less suitable for different applications.

The controller 302 may be in electronic communication with the measurement system 301 or other components of the system 300. The controller 302 may be configured according to any of the embodiments described herein. The controller 302 also may be configured to perform other functions or additional steps using the output of the measurement system 301 or using images, measurements, or data from other sources.

Figure 18:
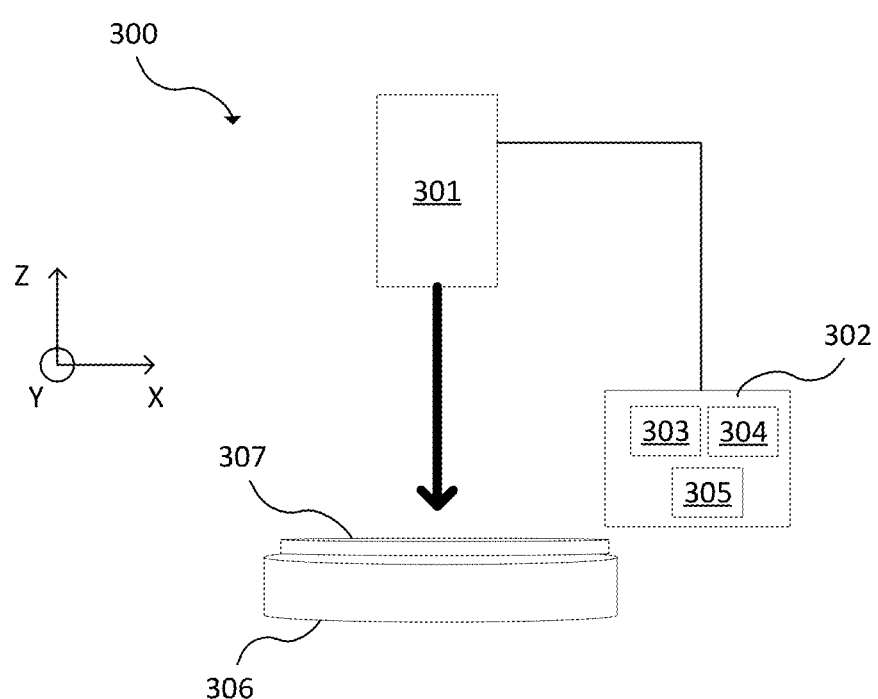
FIG. 18 is a block diagram of a system in accordance with the present disclosure.

An additional embodiment relates to a non-transitory computer-readable medium storing program instructions executable on a controller for performing a computer-implemented method, as disclosed herein. In particular, as shown in FIG. 18, the controller 302 can include a memory in the electronic data storage unit 304 or other electronic data storage medium with non-transitory computer-readable medium that includes program instructions executable on the controller 302. The computer-implemented method may include any step(s) of any method(s) described herein. For example, the controller 302 may be programmed to perform some or all of the steps of FIG. 17 or FIG. 7. The memory in the electronic data storage unit 304 or other electronic data storage medium may be a storage medium such as a magnetic or optical disk, a magnetic tape, or any other suitable non-transitory computer-readable medium known in the art.

In an instance, the processor 303 can be configured to execute one or more software modules, and wherein the one or more software modules are configured to develop a first effective medium dispersion model for a film stack on a wafer and determine a thickness of the first layer using the first effective medium dispersion model. The film stack can include at least four layers. The first effective medium dispersion model substitutes for all but a first layer of the layers. The first layer is a top layer of the film stack opposite the wafer.

Optionally, the software modules can be further configured to develop a second effective medium dispersion model for the film stack based on the thickness of the first layer and determine a thickness of the second layer using the second effective medium dispersion model. The second effective medium dispersion model substitutes for all but the first layer and a second layer of the layers. The second layer is adjacent the first layer.

Optionally, the software modules can be further configured to develop a third effective medium dispersion model for the film stack based on the thickness of the first layer and the thickness of the second layer and determine a thickness of the third layer using the third effective medium dispersion model. The third effective medium dispersion model substitutes for all but the first layer, the second layer, and a third layer of the layers. The third layer is adjacent the second layer.

Software modules can be configured to optionally develop a fourth, fifth, or even more effective medium dispersion models to determine a thickness of other layers in the film stack.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

In another embodiment, the controller 302 may be communicatively coupled to any of the various components or sub-systems of system 300 in any manner known in the art. Moreover, the controller 302 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the controller 302 and other subsystems of the system 300 or systems external to system 300.

In some embodiments, various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single controller 302 (or computer system) or, alternatively, multiple controllers 302 (or multiple computer systems). Moreover, different sub-systems of the system 300 may include one or more computing or logic systems. Therefore, the above description should not be interpreted as a limitation on the present disclosure but merely an illustration.

The examples disclosed herein are meant to be illustrative and are not intended to be limiting.

EXAMPLE 1

In an example, the first effective medium dispersion model replaces five materials in a stack: IL, HK, TiN, TaN and TaL. By floating the first effective medium thickness and eventually the first effective medium Bruggeman effective medium approximation (BEMA) fraction, the first effective medium accounts for all process variation of the five layers together. Thus, the first scatterometry model floating parameters are reduced from the initial twelve parameters to only seven. Using first scatterometry model, the top TiN (8 A) film on grating was accurately measured and all success criteria were met including the robustness test. The top TiN (8 A) thickness was forwarded to another model.

The second effective medium dispersion model replaces four materials: IL, HK, TiN and TaN. By floating the second effective medium thickness and eventually the second effective medium BEMA fraction, the second effective medium accounts for all process variation of the four films together. Thus, the second effective medium dispersion model floating parameters are practically reduced from twelve parameters to only seven parameters plus the top TiN feedforwarded from the first effective medium dispersion model. The top TiN feedforwarded from the first effective medium dispersion model has no interaction or correlation with the second critical parameter measured TaL. While the second effective medium dispersion is developed, the top TiN thickness is fed from the first effective medium dispersion model. The second effective medium dispersion model can be more accurate if data from the first effective medium dispersion model are used to develop the second effective medium dispersion model. This can assure consistency between the first effective medium dispersion model and the second effective medium dispersion model.

The third effective medium dispersion model replaces three materials: IL, HK and TiN. By floating the third effective medium thickness and eventually the third effective medium BEMA fraction, the third effective medium dispersion model accounts for all process variation of the three films together. Thus, the third effective medium dispersion model floating parameters are practically reduced from 12 parameters to only seven parameters plus the top TiN feedforwarded from the first effective medium dispersion model and the TaL feedforwarded from the second effective medium dispersion model. The top TiN and TaL from the first effective medium dispersion model and the second effective medium dispersion model have no interaction or correlation with the third critical parameter measured TaN Similar to the second effective medium dispersion model, while developing the third effective medium dispersion model the TiN thickness and the TaL thickness are feedforwarded from the first effective medium dispersion model and the second effective medium dispersion model, respectively. This can assure consistency between the first effective medium dispersion model, second effective medium dispersion model, and the third effective medium dispersion model.

With respect to measuring the effective medium (EM) dispersion, combining multiple materials in one can improve the contrast, can lead to uniqueness in the optical response, and can reduce parameters interaction. For example, if all six films of FIG. 6 are floated simultaneously, the critical parameters correlation with each other individual film may make the model unstable and not robust enough to pass the customer specifications.

EXAMPLE 2

Figure 8:
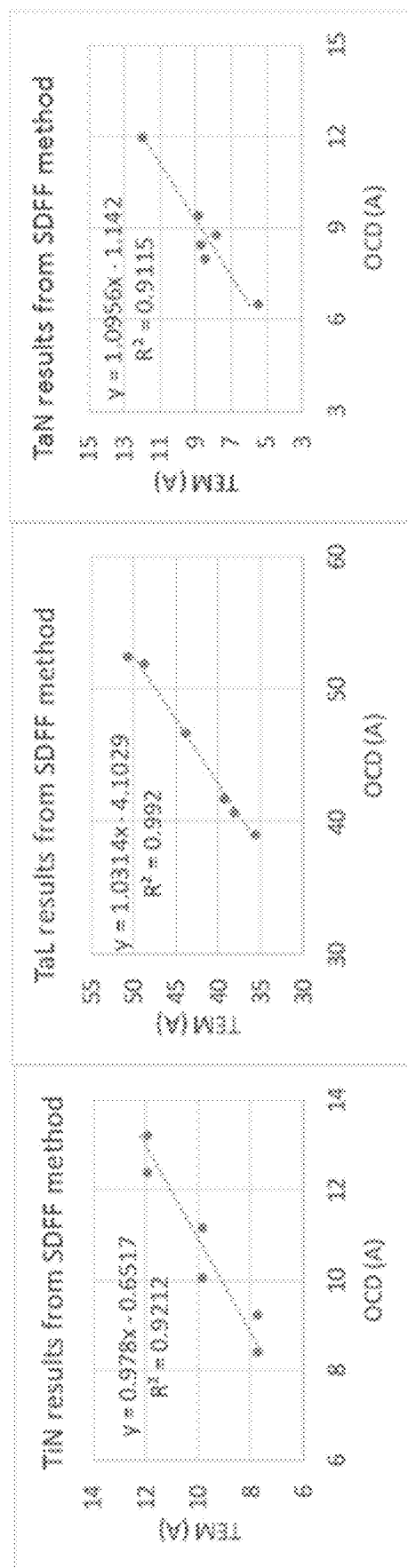
FIG. 8 is an effective medium (EM) based method SSDF Scatterometry (OCD) results compared to TEM measurements.

To validate the within layer feedforward technique in another example, three DOE wafers were designed and measured with the scanned AOI RPRC. Three sites per wafer were selected for the reference measurement TEM. FIG. 8 summarizes the FOG vs. TEM linearity results for TiN, TaL, and TaN using the SSDF method described in FIG. 6. In addition to the accuracy, the SDFF method was tested for precision GRR and robustness. Both R2 and Slope passed the customer requirement for linearity.

Figure 9:
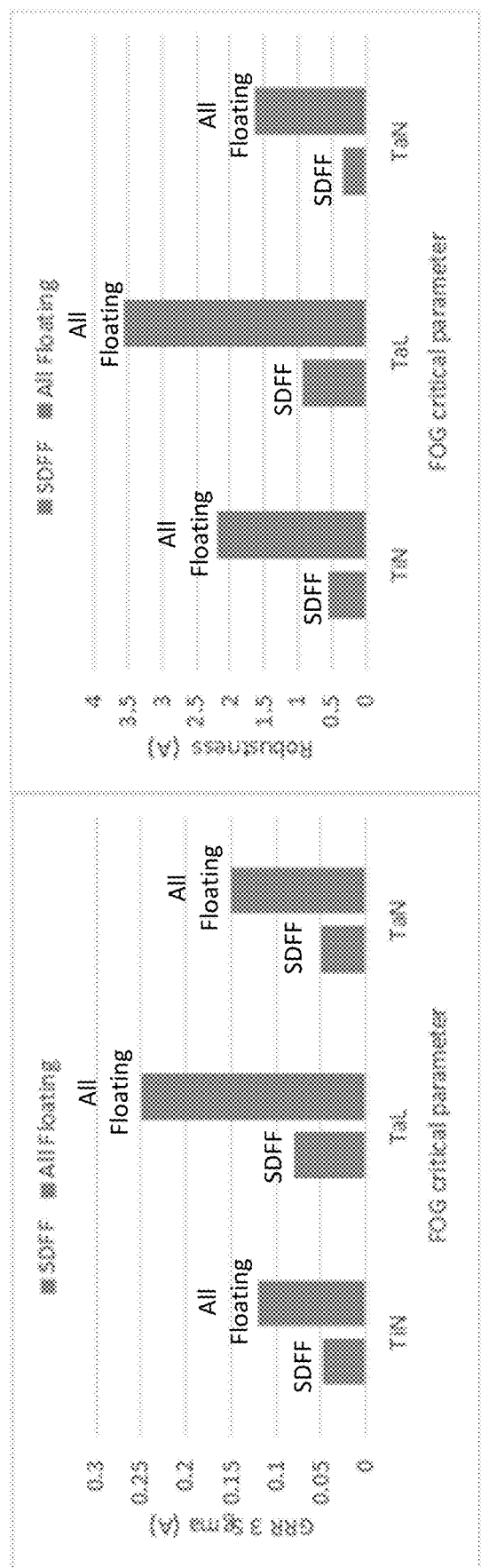
FIG. 9 is SSDF GRR and robustness results compared to all floating method.

FIG. 9 shows the significance of the results of the SSDF method and compared with the old method of "all floating." The GRR and robustness tests are more liable to being affected by the multiple films correlation. Both GRR and Robustness passed the customer specifications.

Successful FOG layers cases including some of the EM dispersion (measured using the Scanned AOI RPRC and used in the libraries) are presented below.

Figure 2:
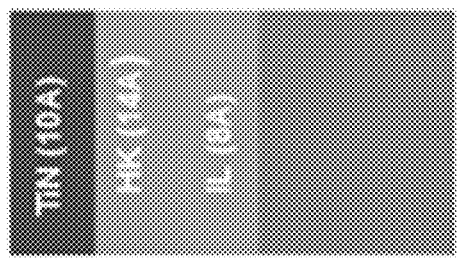
FIG. 2 illustrates (a) a cap layer film stack and (b) the film on grating (FOG) cap model, wherein the single AOI all floating method simulation results showing poor precision (nm) results and high parameter correlation.
Figure 2:
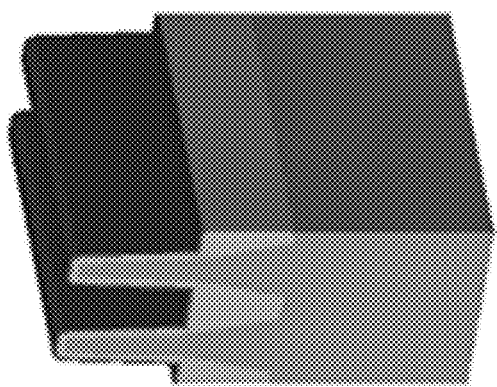
Figure 10:
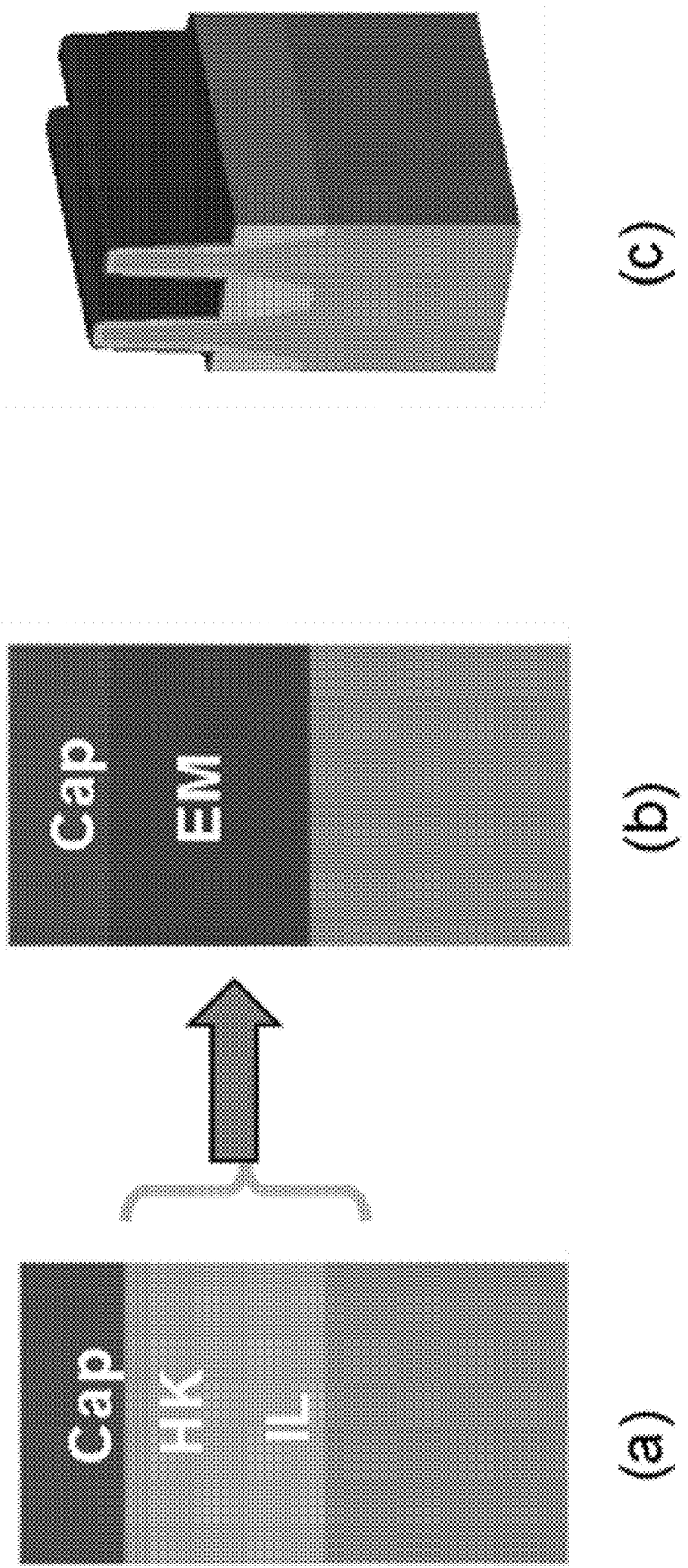
FIG. 10 is (a) the TiN cap film stack, (b) illustration of the EM layer (IL+HK), and (c) the cap FOG model.

FIG. 2(a) shows the cap layer film stack and 2(b) shows the FOG cap structure. Simulated precisions are poor because of the highly correlated parameters. Instead of floating three conformal liners simultaneously, the effective medium approach was used here too. IL+HK liners were mixed as one effective medium liner as illustrated in FIG. 10.

Figure 11:
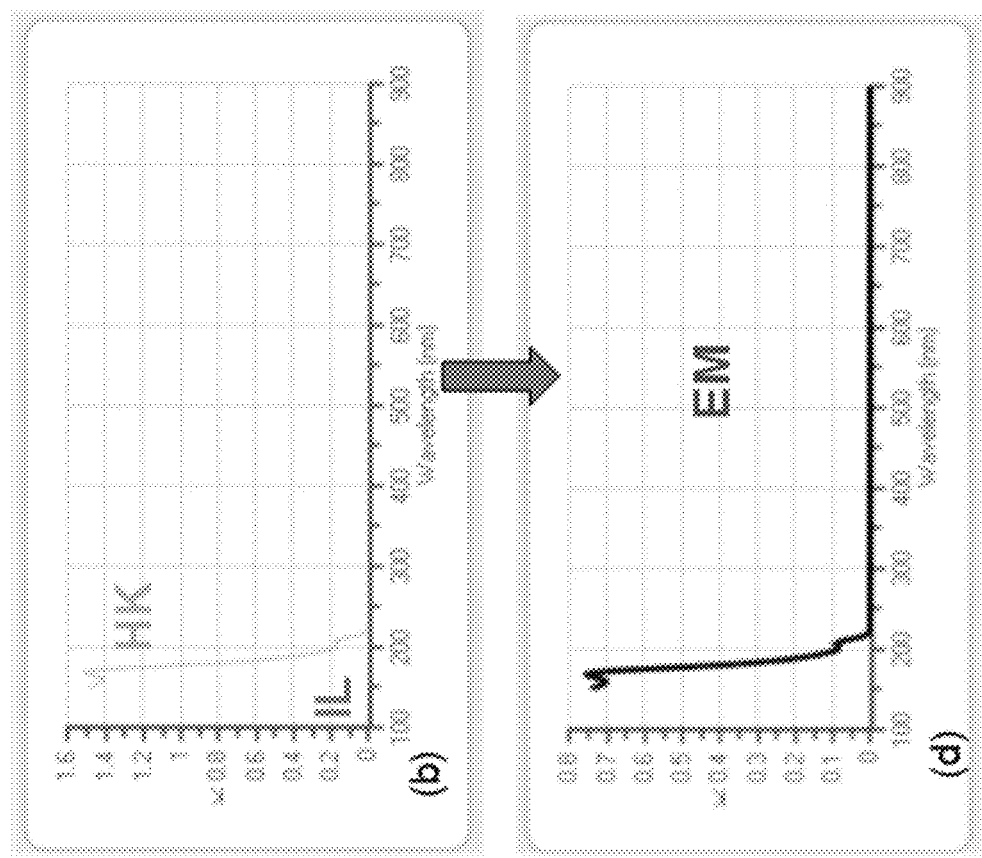
FIG. 11 is (a) IL ($SiO_2$) and HK ($HfO_2$) Refractive indexes N, (b) IL ($SiO_2$) and HK ($HfO_2$) extinction coefficients K, (c) experimental EM refractive index N measured with the scanned AOI spectra, and (d) experimental EM extinction coefficient k measured with the scanned AOI spectra.
Figure 11:
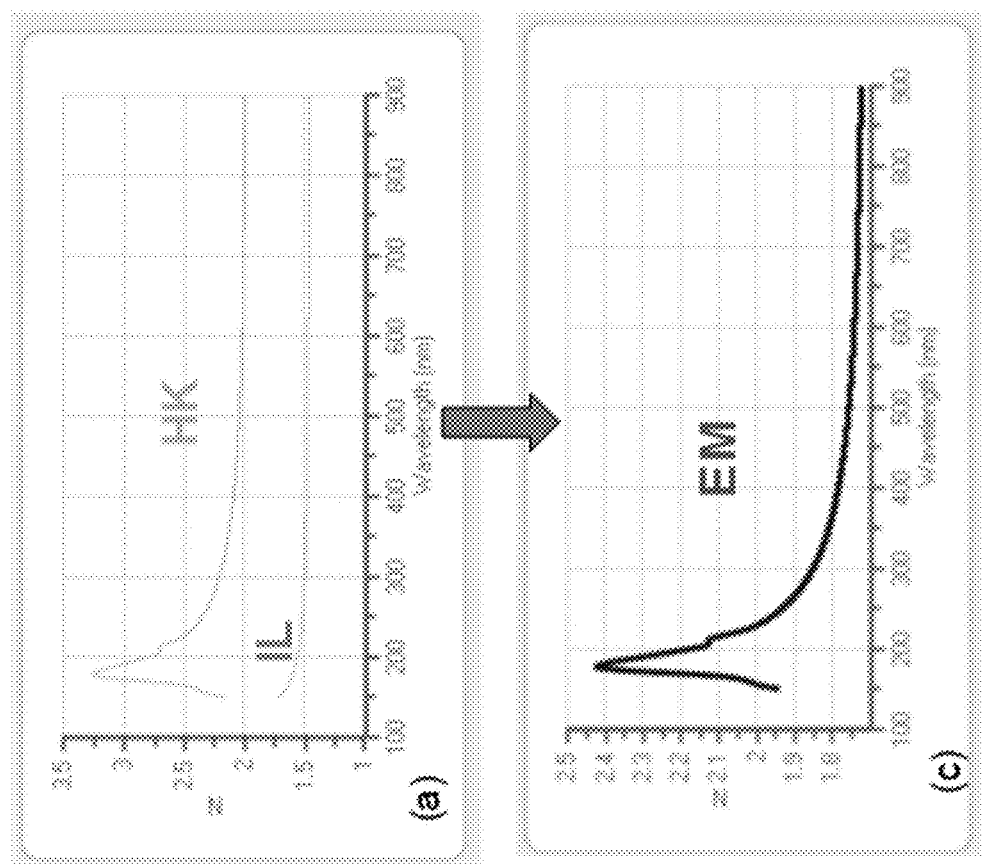
Figure 12:
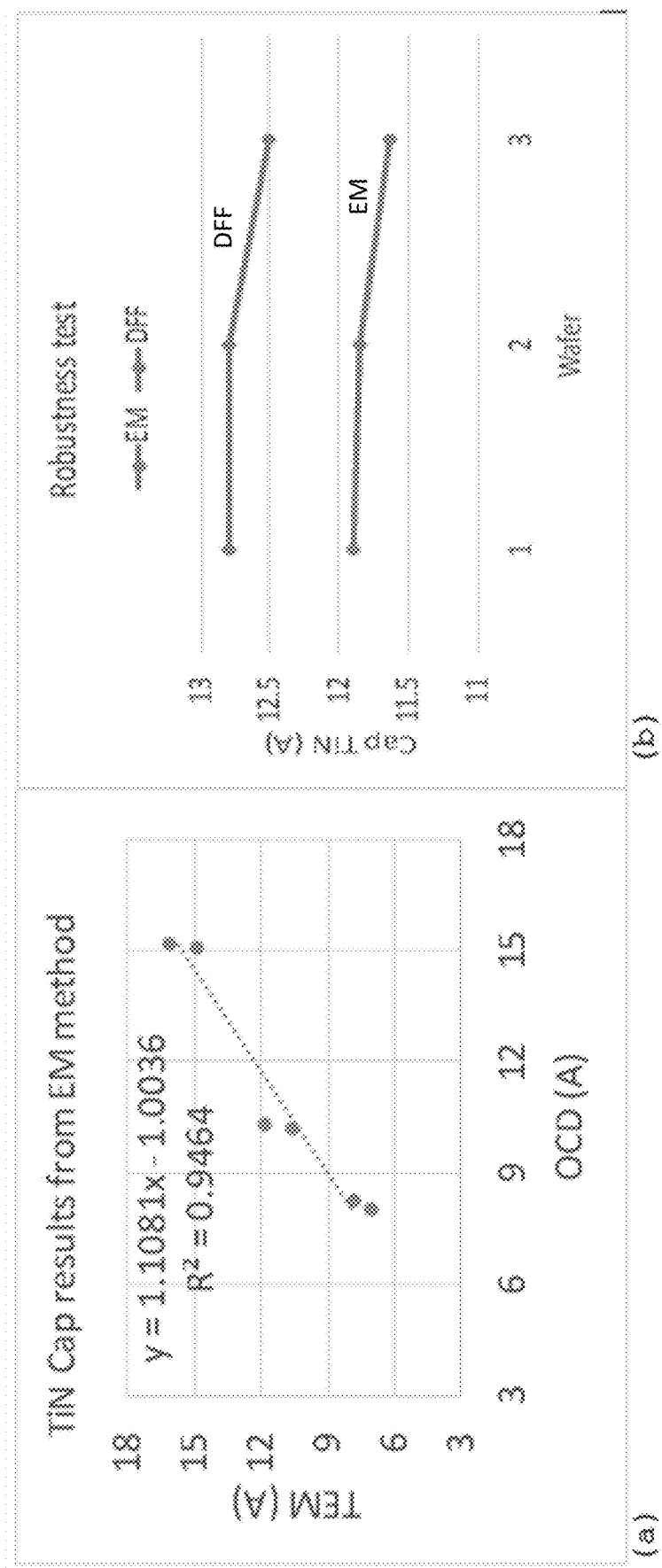
FIG. 12 is (a) EM based method scatterometry (OCD) results compared to TEM measurements and (b) robustness test results using EM method compared to DFF, wherein both EM and DFF are within the exemplary semiconductor manufacturer specifications of 0.5 A TiN, wherein the prelayer HK thickness is varied while top TiN is kept at the POR value, and the EM method measures stable TiN within less than 0.5 A.

Scanned AOI spectra were regressed to optimize the EM dispersion model. The same method described in FIG. 7 is applied for the cap layer of FIG. 10. The resulted EM dispersion of (IL+HK) is shown on FIG. 11. IL and HK dispersions are shown for reference.

Figure 3:
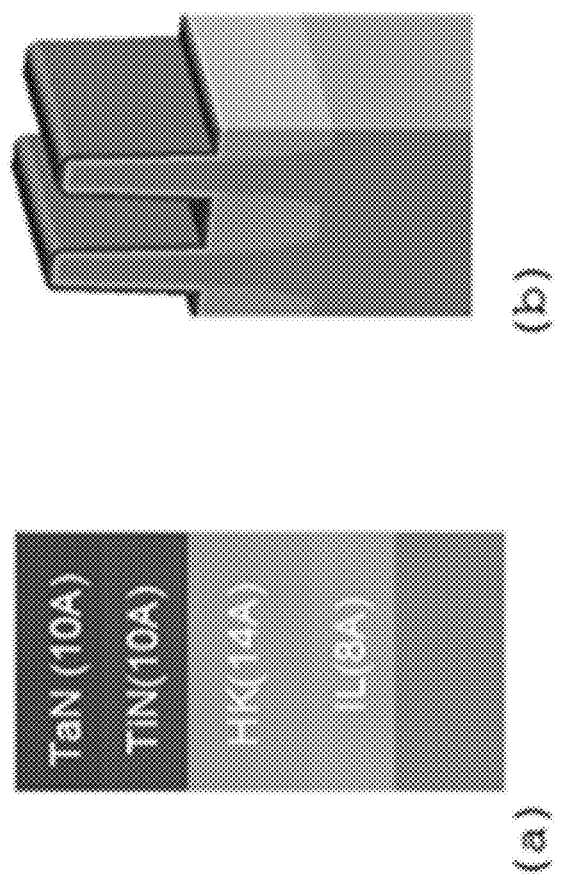
FIG. 3 illustrates (a) a TaN layer film stack and (b) the FOG TaN model, which were subject to the single AOI all floating method simulation.
Figure 13:
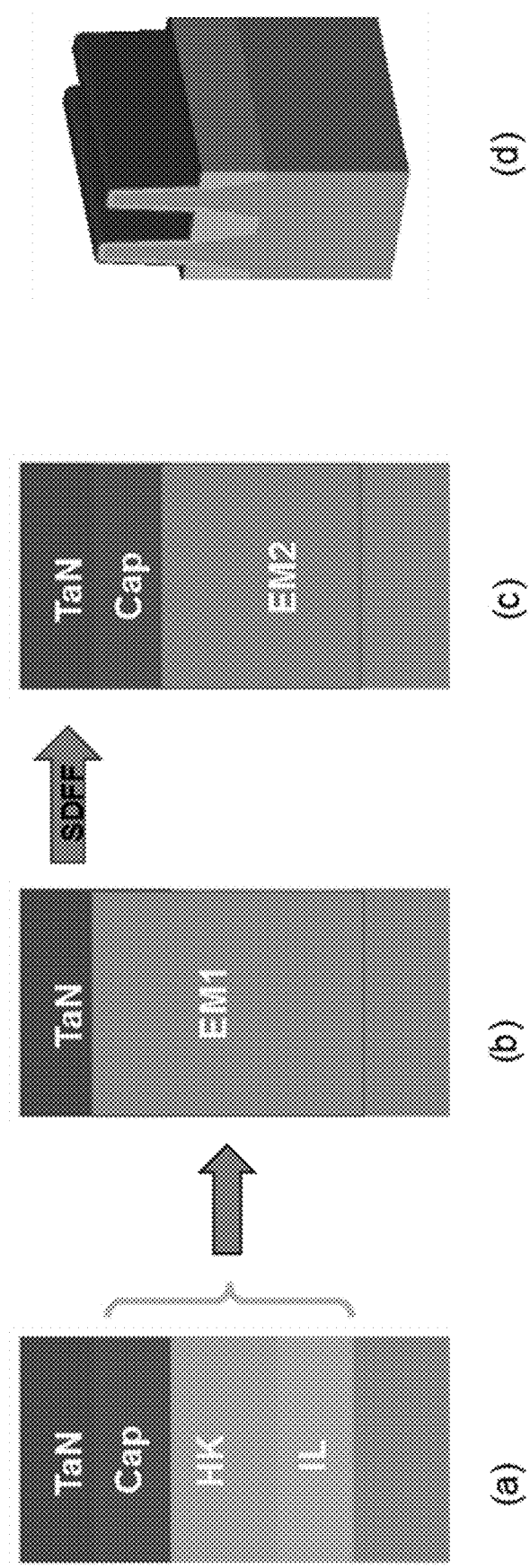
FIG. 13 is (a) The TaN film stack, (b) illustration of EM model1-EM1 layer (IL+HK+TiN), (c) SDFF from model1 to model2-EM2 layer (IL+HK), and (d) the TaN FOG model.
Figure 14:
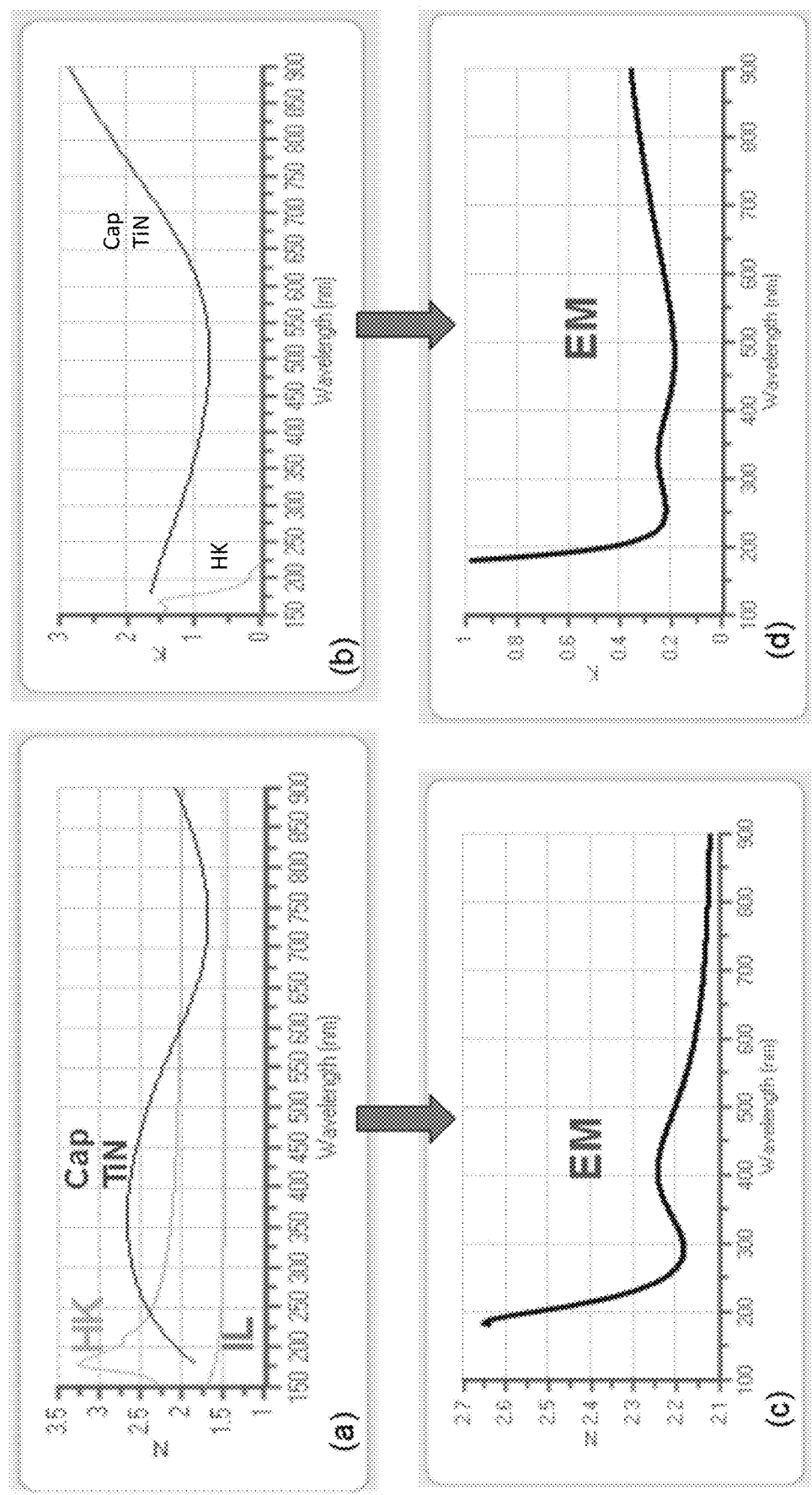
FIG. 14 is (a) IL ($SiO_2$), HK ($HfO_2$), and TiN Refractive indexes N, (b) IL ($SiO_2$), HK ($HfO_2$) and TiN extinction coefficients K, (c) experimental EM1 refractive index N measured with the scanned AOI spectra, and (d) experimental EM1 extinction coefficient k measured with the scanned AOI spectra.
Figure 15:
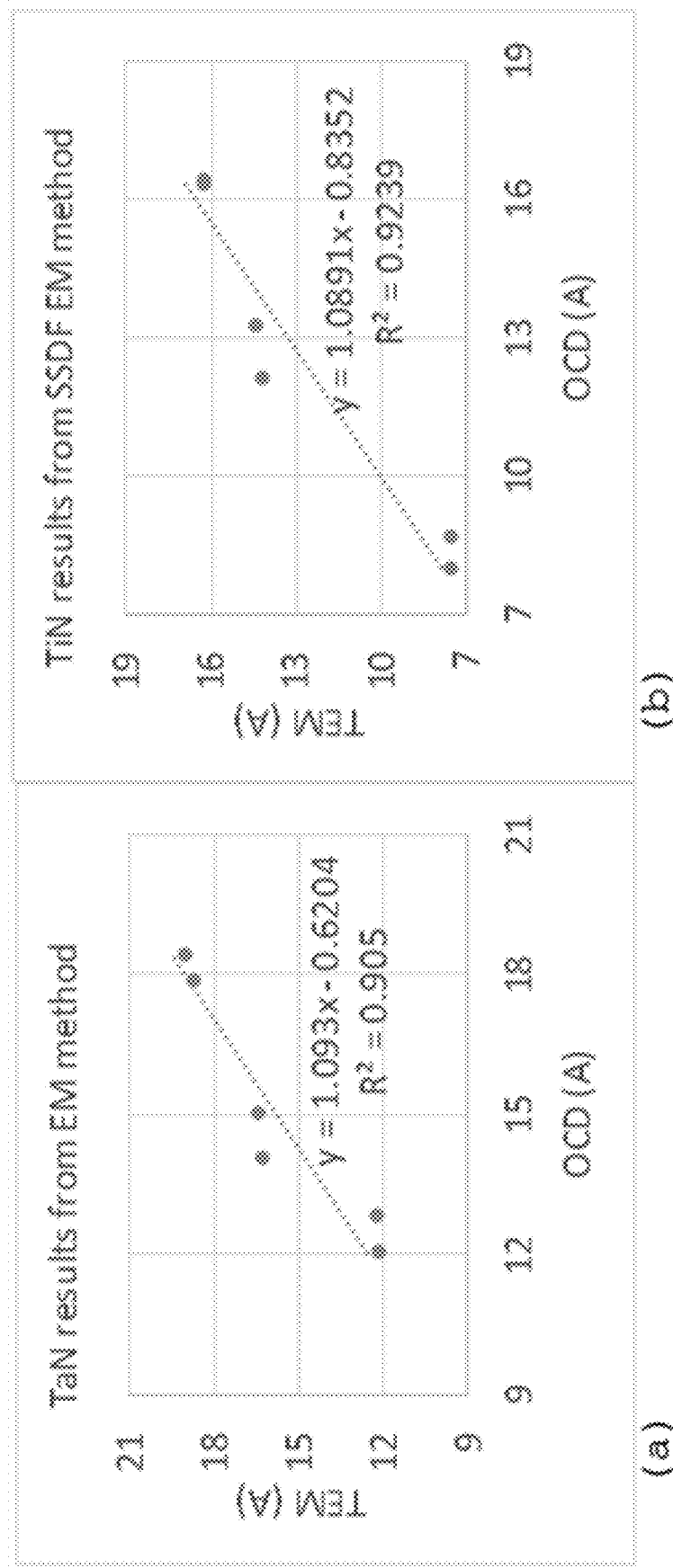
FIG. 15 is EM based method SSDF Scatterometry (OCD) results compared to TEM measurements for (a) TaN and (b) TiN from the TaN layer of FIG. 12.
Figure 16:
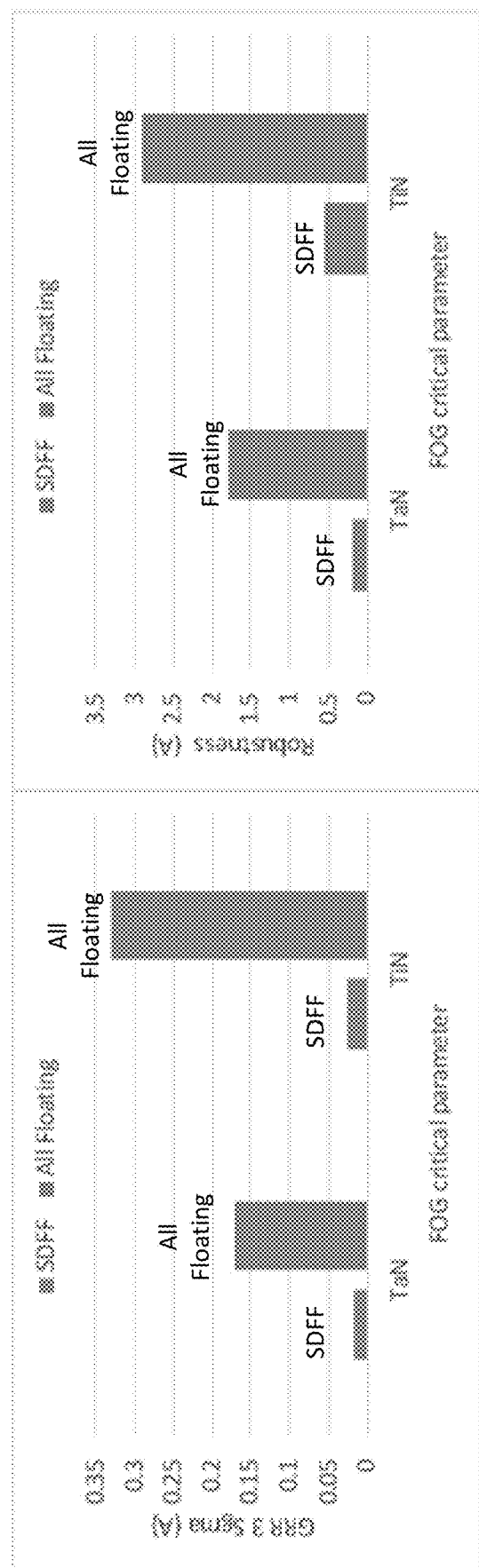
FIG. 16 is SDFF GRR and robustness results compared to all floating method.

FIG. 3(a) shows the cap layer film stack and 3(b) shows the FOG cap structure. Simulated precision are poor because of the highly correlated parameters. FIG. 13(a) shows the TaN layer film stack. Instead of floating four conformal liners simultaneously, the effective medium approach was used here. IL+HK+Cap liners were mixed as one effective medium liner as illustrated in FIG. 13.

With constant advances in nano fabrication capabilities of the metal gate in FinFET and nanowires, film on grating metrology appears to be restricted by the natural optical properties used to build the HKMG and their thin thicknesses compared to the wavelength. The above experimental results show that more accurate results can be obtained when one or more mediums are combined and considered one medium. The effective medium theory is used to define and study the effective refractive index and effective extinction coefficients for a composite of materials or thin films in terms of their individual components and their geometry. As disclosed herein, the effective medium theory is used for thin film on grating. The validity of the theory may be restricted by the size of each film composing the structures. The films may need to be small enough to appear homogenous to the incident light wavelength. Multi films are modeled as one effective film as the total thickness is much smaller than the wavelength. The effective medium can statistically explain the behavior of the composite. For example, in the simple case of FIG. 10 the problem is to get the effective parameters of the alternating effective films made of IL ($SiO_2$) and HK ($HfO_2$) with relative dielectric functions $\varepsilon SiO_2$ and $\varepsilon HfO_2$ and thicknesses TIL and THK. The effective dielectric permittivity for a non-magnetic structures can follow the following equation.

$$D = \varepsilon_0 \varepsilon_{eff} E$$

D is the spatial average displacement field and E is the electric field. Using the boundary condition that E is continuous and by averaging the displacement field D by volume, the following formula can be determined.

$$\varepsilon_{eff} = \frac{T_{IL}}{T_{HK} + T_{IL}} \varepsilon_{IL} + \frac{T_{HK}}{T_{HK} + T_{IL}} \varepsilon_{HK}$$

This equation is a simple model to describe the effective medium optical properties. The T variables are thicknesses of the various layers and $\varepsilon_{HK}$ is the effective parameter of the HK layer. Practically, a weighting function could be included in this model. This simple theory states that any effective dielectric permittivity is a function of the thicknesses which are unknown. Hence the accurate determination of the effective dielectric permittivity (FIG. 7) is a factor.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
 developing, using a controller, a first effective medium dispersion model for a film stack on a wafer that models optical properties of less than an entirety of the film stack, wherein the film stack includes at least four layers, wherein the first effective medium dispersion model substitutes for all but a first layer of the layers whereby the first effective medium dispersion model substitutes for at least a second layer, a third layer, and a fourth layer in the film stack, and wherein the first layer is a top layer of the film stack opposite the wafer;
 determining, using the controller, a thickness of the first layer using the first effective medium dispersion model;
 developing, using the controller, a second effective medium dispersion model for the film stack that models optical properties of less than the entirety of the film stack based on the thickness of the first layer, wherein the second effective medium dispersion model substitutes for all but the first layer and the second layer of the layers whereby the second effective medium dispersion model substitutes for at least the third layer and the fourth layer, and wherein the second layer is adjacent the first layer;
 determining, using the controller, a thickness of the second layer using the second effective medium dispersion model;
 developing, using the controller, a third effective medium dispersion model for the film stack that models optical properties of less than the entirety of the film stack based on the thickness of the first layer and the thickness of the second layer, wherein the third effective medium dispersion model substitutes for all but the first layer, the second layer, and the third layer of the layers whereby the third effective medium dispersion model substitutes for at least the fourth layer, and wherein the third layer is adjacent the second layer; and
 determining, using the controller, a thickness of the third layer using the third effective medium dispersion model.

2. The method of claim 1, wherein the layers include an oxide layer, a high k layer, a TiN layer, a TaN layer, a TaL layer, and a second TiN layer.

3. The method of claim 2, wherein the first layer is the second TiN layer, the second layer is the TaL layer, and the third layer is the TaN layer.

4. The method of claim 2, wherein a combined thickness of the oxide layer, the high k layer, the TiN layer, the TaN layer, and the TaL layer is 8 nm or less.

5. The method of claim 1, wherein the first effective medium dispersion model substitutes for an oxide layer, a high k layer, a TiN layer, a TaN layer, a TaL layer, wherein the second effective medium dispersion model substitutes for an oxide layer, a high k layer, a TiN layer, and a TaN layer, and wherein the third effective medium dispersion model substitutes for an oxide layer, a high k layer, and a TiN layer.

6. The method of claim 1, wherein the first effective medium dispersion model, the second effective medium dispersion model, and the third effective medium dispersion model each have different optical properties.

7. The method of claim 1, further comprising measuring the film stack by one or more of generating rotating polarizer rotating compensator spectroscopic ellipsometry data, full Muller matrix components data, rotating polarizer spectroscopic ellipsometry data, reflectometry data, laser driven spectroscopic reflectometry data, or x-ray data.

8. The method of claim 1, wherein developing the first effective medium dispersion model includes:
 collecting optical responses of the film stack;
 building a first scatterometry model, using a model building module, by combining all but the first layer of the layers in a first effective medium;
 creating a dispersion model for the first effective medium that includes a dispersion formula;
 receiving the optical responses at multiple angles of incidence at a fitting analysis module;
 performing, using the fitting analysis module, parallel fitting on the optical responses while floating the dispersion model in each spectrum regression;
 evaluating one or more outcomes of the dispersion model at the angles of incidence to determine similarity;
 transforming the dispersion model into a table;
 performing a fitting analysis using the first scatterometry model where the dispersion model is fixed as the table and the thickness of the first layer is floating;
 measuring the thickness of the first layer; and
 comparing the thickness of the first layer to a reference.

9. The method of claim 8, further comprising applying a feedback loop configured to optimize the dispersion model after the evaluating, wherein the feedback loop is configured to fix or float parameters of the dispersion model.

10. The method of claim 8, wherein at least one parameter of the dispersion model is treated as common during the parallel fitting.

11. The method of claim 1, wherein developing the second effective medium dispersion model includes:
   building a second scatterometry model, using a model building module, by combining all but the first layer and the second layer of the layers in a second effective medium;
   forwarding the thickness of the first layer into the second scatterometry model;
   creating a dispersion model for the second effective medium that includes a dispersion formula;
   receiving the optical responses at multiple angles of incidence at a fitting analysis module;
   performing, using the fitting analysis module, parallel fitting on the optical responses while floating the dispersion model in each spectrum regression;
   evaluating one or more outcomes of the dispersion model at the angles of incidence to determine similarity;
   transforming the dispersion model into a table; and
   performing a fitting analysis using the second scatterometry model where the dispersion model is fixed.

12. The method of claim 11, further comprising applying a feedback loop configured to optimize the dispersion model after the evaluating, wherein the feedback loop is configured to fix or float parameters of the dispersion model.

13. The method of claim 11, wherein at least one parameter of the dispersion model is treated as common during the parallel fitting or the thickness of the first layer is treated as common during the parallel fitting.

14. The method of claim 1, wherein developing the third effective medium dispersion model includes:
   building a third scatterometry model, using a model building module, by combining all but the first layer, the second layer, and the third layer of the layers in a third effective medium;
   forwarding the thickness of the first layer and the thickness of the second layer into the third scatterometry model;
   creating a dispersion model for the third effective medium that includes a dispersion formula;
   receiving the optical responses at multiple angles of incidence at a fitting analysis module;
   performing, using the fitting analysis module, parallel fitting on the optical responses while floating the dispersion model in each spectrum regression;
   evaluating one or more outcomes of the dispersion model at the angles of incidence to determine similarity;
   transforming the dispersion model into a table; and
   performing a fitting analysis using the third scatterometry model where the dispersion model is fixed.

15. The method of claim 14, further comprising applying a feedback loop configured to optimize the dispersion model after the evaluating, wherein the feedback loop is configured to fix or float parameters of the dispersion model.

16. The method of claim 14, further comprising reporting the thickness of the first layer, the thickness of the second layer, and the thickness of the third layer.

17. The method of claim 14, wherein at least one parameter of the dispersion model is treated as common during the parallel fitting or the thickness of the first layer is treated as common during the parallel fitting.

18. The method of claim 1, wherein the film stack is one of a 1D film stack, a 2D film on grating, or a 3D film on grating.

19. The method of claim 1, wherein the at least four layers are each one of $SiO_2$, $HfO_2$, HfSiON, HfON with a nitrogen concentration, TiN, TaN, TaAlC, TiAlC, W, Co, WC, or TaO.

20. The method of claim 19, wherein at least one of the four layers is one of HfON, TiN, or TaN, and further comprising determining a nitrogen concentration.

21. The method of claim 1, wherein one of the first effective medium dispersion model, the second effective medium dispersion model, or the third effective medium dispersion model is a dispersion formula that models the optical properties of a material as a function of photon energy or wavelength.

22. A computer program product comprising a non-transitory computer readable storage medium having computer readable program embodied therewith, the computer readable program configured to carry out the method of claim 1.

* * * * *